(12) United States Patent
Bao et al.

(10) Patent No.: US 11,827,520 B2
(45) Date of Patent: Nov. 28, 2023

(54) ORIENTATION OF MATERIALS VIA APPLICATION OF A MAGNETIC FIELD AND USE OF MAGNETICALLY-ORIENTED DEVICES AND DEVICE COMPONENT

(71) Applicant: University of Houston System, Houston, TX (US)

(72) Inventors: Jiming Bao, Pearland, TX (US); Feng Lin, Houston, TX (US); Zhuan Zhu, Freemont, CA (US); Zhiming Wang, Sichuan (CN)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 647 days.

(21) Appl. No.: 16/333,547

(22) PCT Filed: Sep. 19, 2017

(86) PCT No.: PCT/US2017/052238
§ 371 (c)(1),
(2) Date: Mar. 14, 2019

(87) PCT Pub. No.: WO2018/053496
PCT Pub. Date: Mar. 22, 2018

(65) Prior Publication Data
US 2019/0256358 A1 Aug. 22, 2019

Related U.S. Application Data

(60) Provisional application No. 62/432,767, filed on Dec. 12, 2016, provisional application No. 62/396,334, filed on Sep. 19, 2016.

(51) Int. Cl.
*B32B 9/00* (2006.01)
*C01B 32/194* (2017.01)
(Continued)

(52) U.S. Cl.
CPC ............ *C01B 32/194* (2017.08); *C01B 32/21* (2017.08); *H01G 11/36* (2013.01); *H10N 50/00* (2023.02);
(Continued)

(58) Field of Classification Search
CPC .......... H01B 1/24; H01B 40/00; B82Y 30/00; Y10T 428/30
(Continued)

(56) References Cited

U.S. PATENT DOCUMENTS 4,064,453 A 12/1977 Haas et al.
7,326,497 B2* 2/2008 Matsubara ............... H01B 1/24
429/231.8
(Continued)

FOREIGN PATENT DOCUMENTS

WO 2015/103435 A1 7/2015

OTHER PUBLICATIONS

PCT/US2017/052238 International Search Report and Written Opinion dated Nov. 27, 2017 (21 p.).
(Continued)

*Primary Examiner* — Daniel H Miller
(74) *Attorney, Agent, or Firm* — CONLEY ROSE, P.C.

(57) ABSTRACT

Discussed herein are methods of orienting one-dimensional and two-dimensional materials via the application of stationary and rotating magnetic fields. The oriented one-dimensional and two-dimensional materials may exhibit macroscopic properties, and may be employed in various measurement devices as well as thermal and electrical shielding applications or battery devices. A single 1D or 2D material may be suspended in another material such as dionized water, polymer(s), or other materials during the orientation, and the suspension may remain as a liquid or may be solidified or partially solidified to secure the oriented
(Continued)

material(s) into place. The 1D and 2D materials that respond to the magnetic orientation may further cause other elements of the suspension to be oriented in a similar manner.

20 Claims, 19 Drawing Sheets

(51) Int. Cl.
*C01B 32/21* (2017.01)
*H01G 11/36* (2013.01)
*H10N 50/00* (2023.01)
*H10N 50/85* (2023.01)
*B82Y 30/00* (2011.01)

(52) U.S. Cl.
CPC .............. *H10N 50/85* (2023.02); *B82Y 30/00* (2013.01); *Y10T 428/30* (2015.01)

(58) Field of Classification Search
USPC ........................................ 429/231.8; 428/408
See application file for complete search history.

(56) References Cited

U.S. PATENT DOCUMENTS

| | | | |
|---|---|---|---|
| 7,660,081 B2 | 2/2010 | Daughton et al. | |
| 2010/0028681 A1* | 2/2010 | Dai | B82Y 40/00 252/301.16 |
| 2010/0303706 A1* | 12/2010 | Wallace | C01B 32/15 423/445 B |
| 2011/0024158 A1 | 2/2011 | Tsotsis et al. | |
| 2012/0049239 A1 | 3/2012 | Sung | |
| 2013/0334467 A1* | 12/2013 | Zhou | H01M 4/583 252/500 |
| 2015/0187456 A1 | 7/2015 | Ji et al. | |

OTHER PUBLICATIONS

Billaud, Juliette, et al., "Manetically Aligned Graphite Electrodes for High-Rate Performance Li-ion Batteries," Nature Energy, vol. 1, Article 16097, Jul. 4, 2016, pp. 1-6 (6 p.).

* cited by examiner

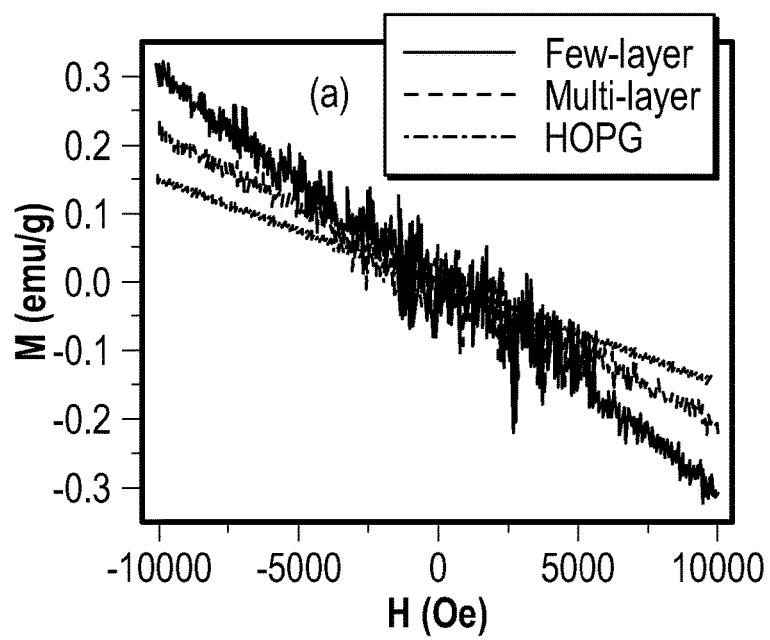
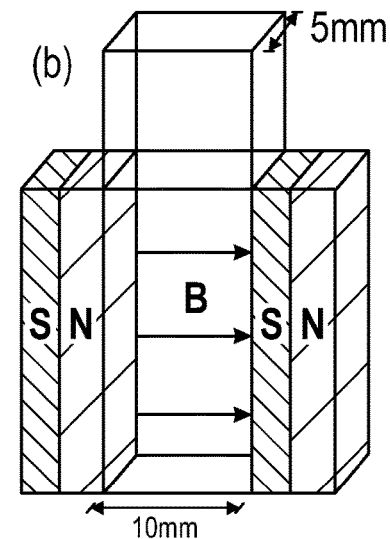
FIG. 1A
FIG. 1B
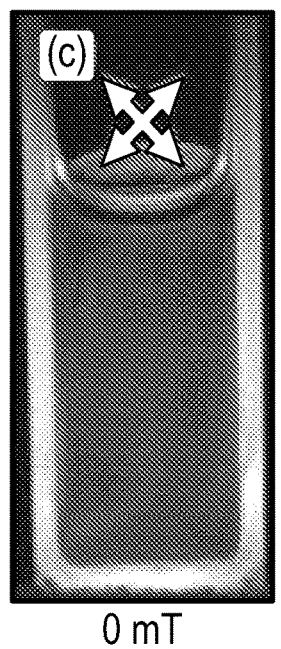
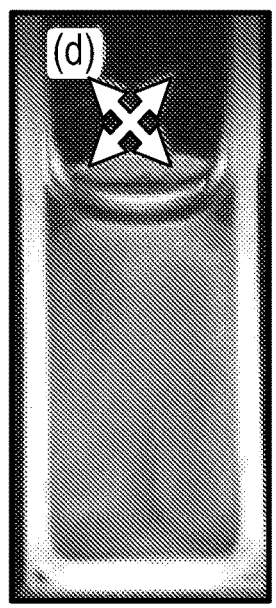
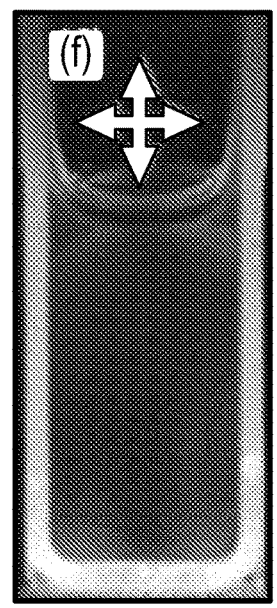
0 mT
240 mT
0 mT
240 mT
FIG. 1C
FIG. 1D
FIG. 1E
FIG. 1F

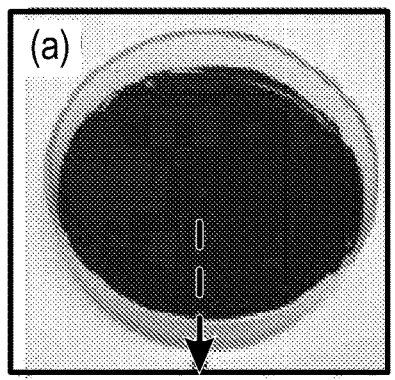
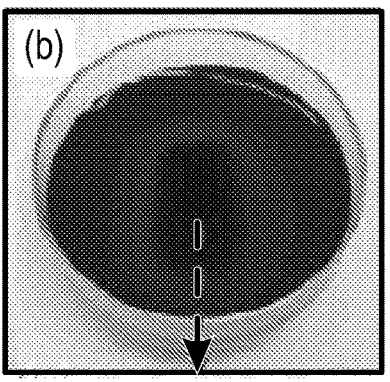
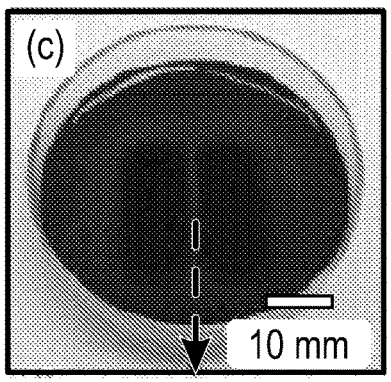
FIG. 2A | FIG. 2B | FIG. 2C
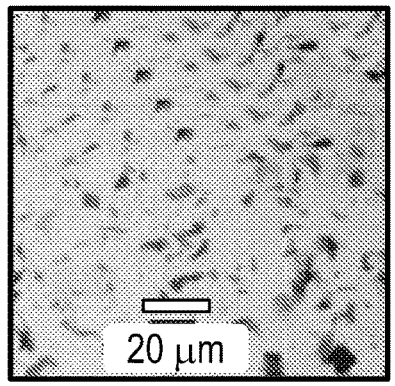
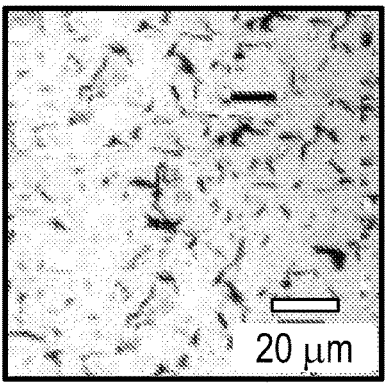
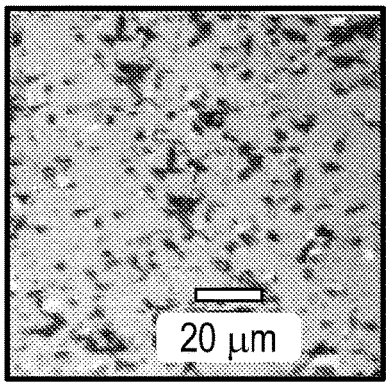
FIG. 2D | FIG. 2E | FIG. 2F
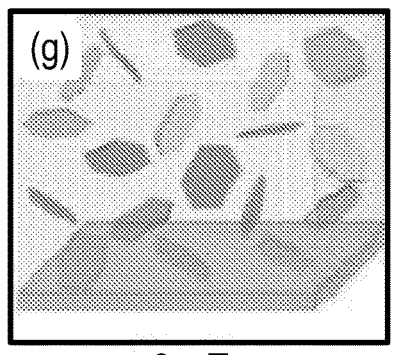
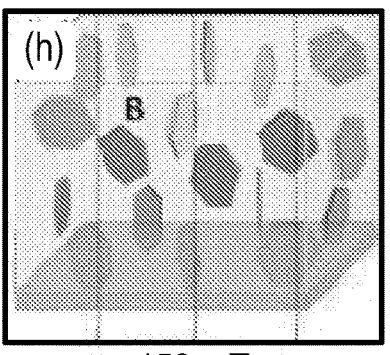
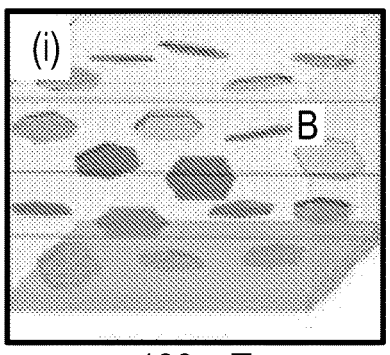
0 mT | 150 mT | 100 mT
FIG. 2G | FIG. 2H | FIG. 2I

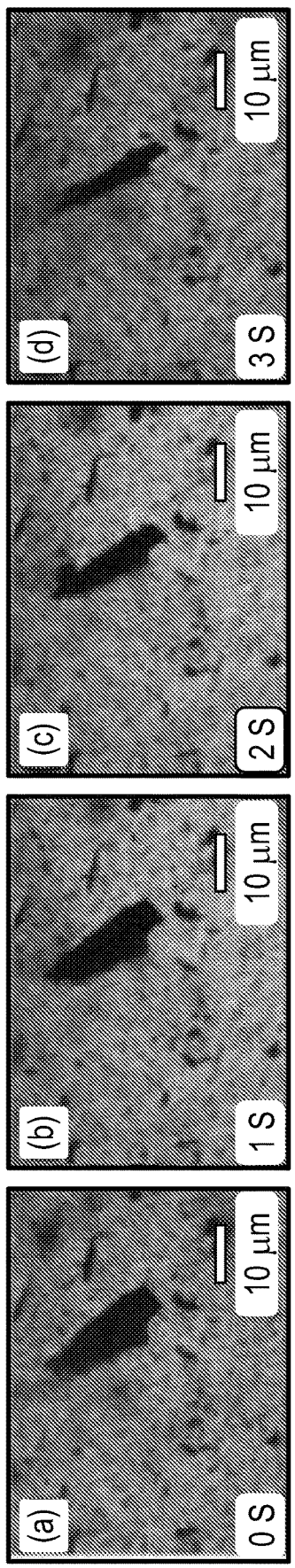
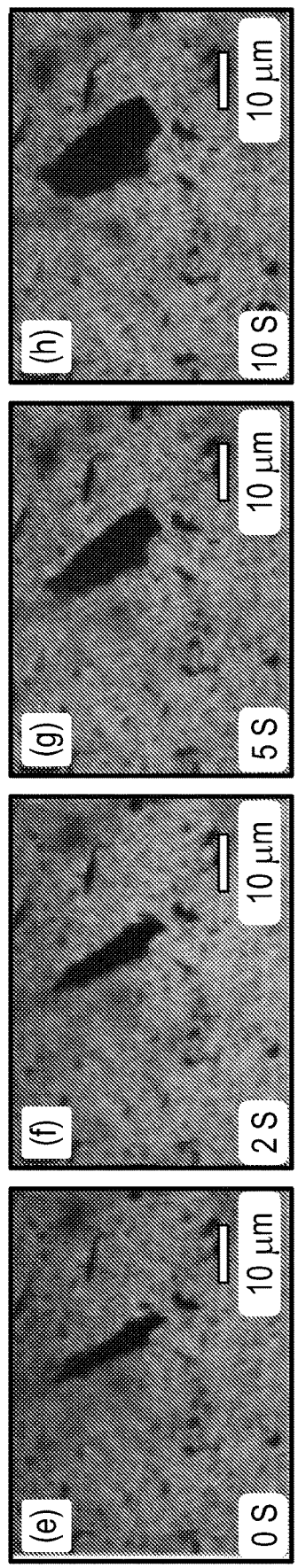
FIG. 3A FIG. 3B FIG. 3C FIG. 3D
FIG. 3E FIG. 3F FIG. 3G FIG. 3H Magnets

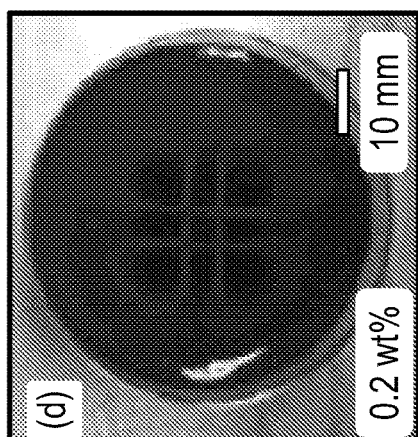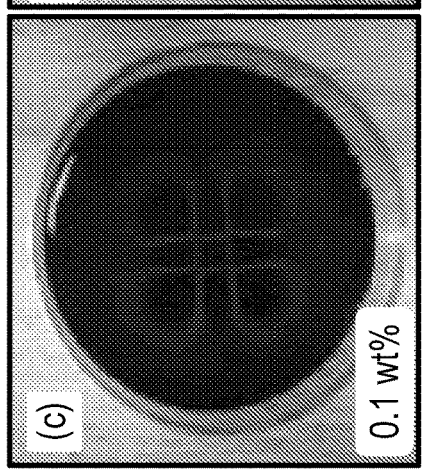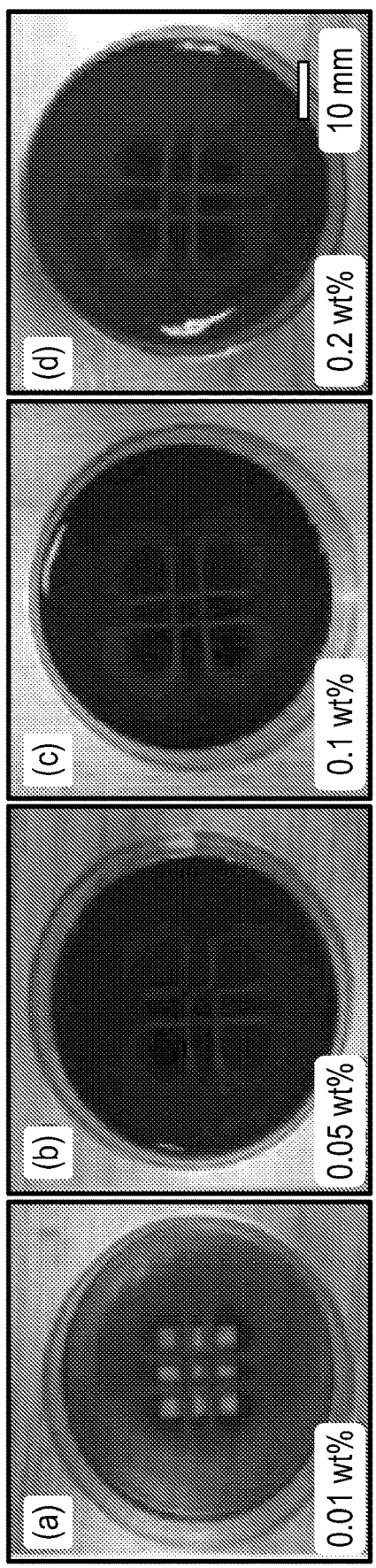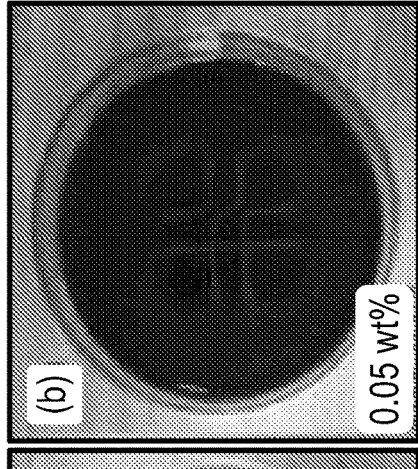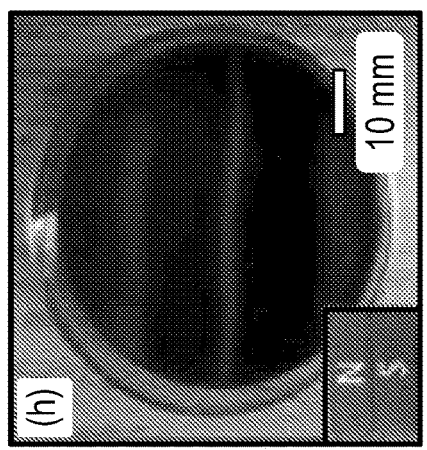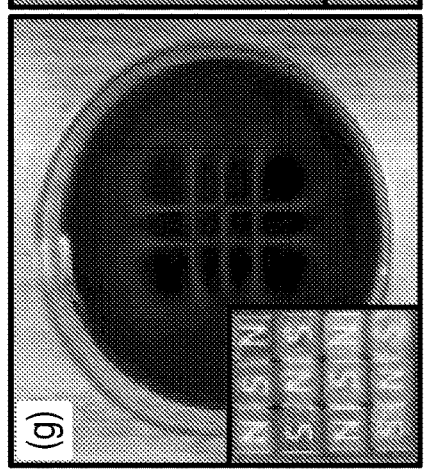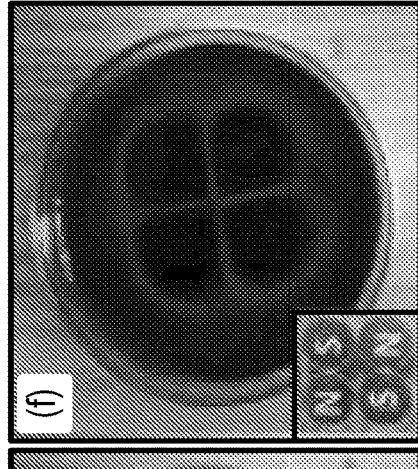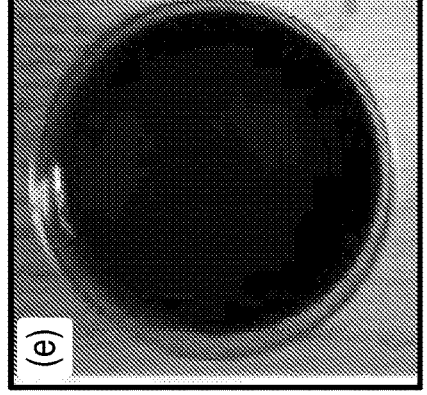

Magnets

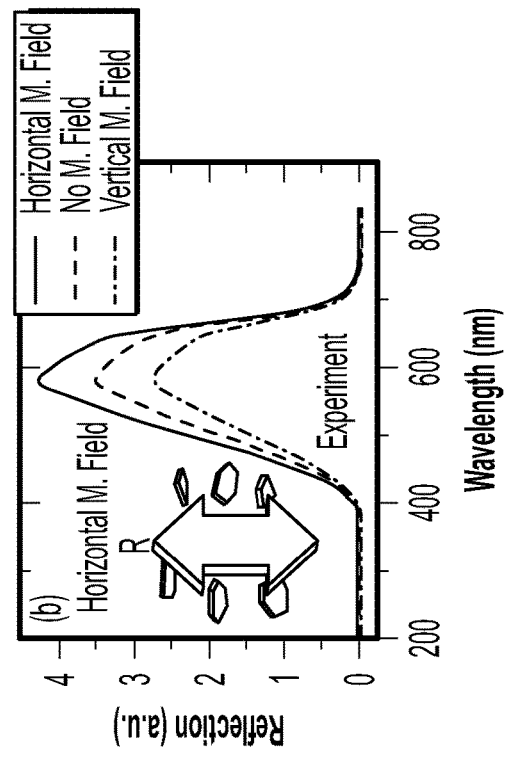
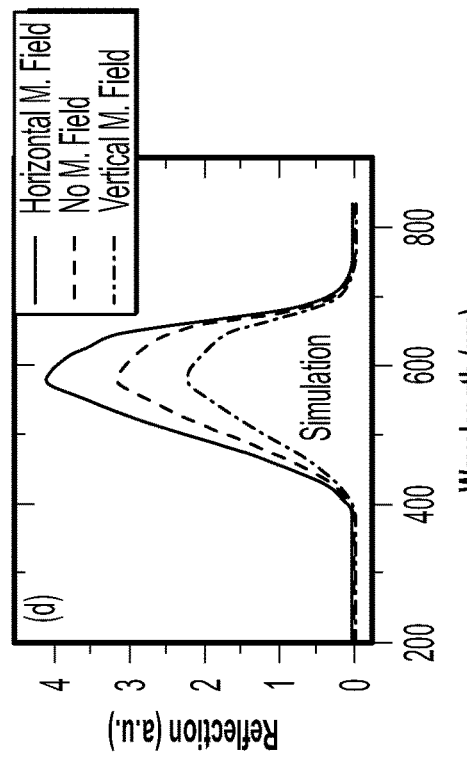
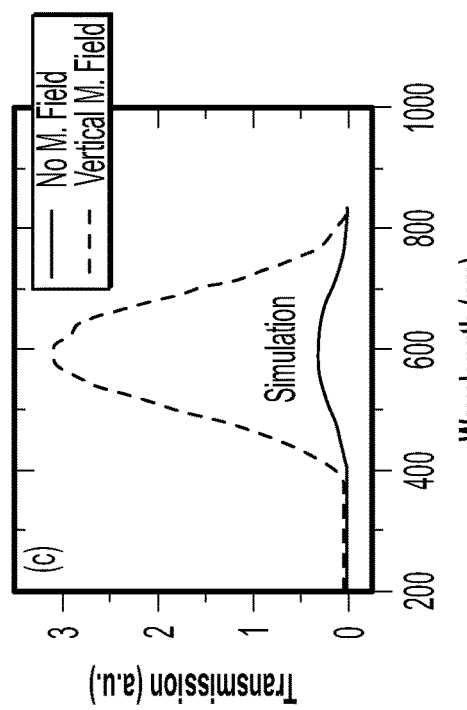
FIG. 9A
FIG. 9B
FIG. 9C
FIG. 9D (a)

(b)

ORIENTATION OF MATERIALS VIA APPLICATION OF A MAGNETIC FIELD AND USE OF MAGNETICALLY-ORIENTED DEVICES AND DEVICE COMPONENT

CROSS-REFERENCE TO RELATED APPLICATIONS

This application is a 35 U.S.C. § 371 national stage application of PCT/US2017/052238 filed Sep. 19, 2017, and entitled "Orientation of Materials via Application of a Magnetic Field and use of Magnetically-Oriented Devices and Device Component," which claims priority to U.S. Application No. 62/396,334, "Magnetic Alignment of Graphene/Graphite Flakes and their Device Applications," filed Sep. 19, 2016, and to U.S. Application No. 62/432,767, "Orientation Control Via Magnetic Fields and Applications Thereof," filed Dec. 12, 2016, each of which is incorporated herein by reference in their entirety for all purposes.

STATEMENT REGARDING FEDERALLY SPONSORED RESEARCH OR DEVELOPMENT

This research was sponsored by the National Science Foundation under grant ECCS-1240510.

BACKGROUND

Nanotechnology and nanoscience include the development and manipulation of nanoparticles of various shapes, sizes, and configurations. Nanoscale materials may be fabricated and employed in various technologies, and continuing developments in measurement technologies contribute to the development of these materials and of applications of these materials. Macroscopic ordering of nanomaterials may be employed to align billions of nanoparticles of various geometries in order to obtain a collective response or property such that the materials may be used in various applications that harness those properties.

BRIEF DESCRIPTION OF THE DRAWINGS

For a detailed description of the exemplary embodiments disclosed herein, reference will now be made to the accompanying drawings in which:

FIGS. 1A-1H illustrate the diamagnetic susceptibility and magnetic field induced birefringence of graphene flakes dispersed in N-methyl-2-pyrrolidone (NMP) according to certain embodiments of the present disclosure.

FIGS. 2A-2I illustrate pictures and schematics of the magnetic response of flakes of the multi-layer graphene flakes by using suspension of multi-layer graphene flakes in DI water in a plastic beaker and placing magnets directly below each suspension according to certain embodiments of the present disclosure.

FIGS. 3A-3H are snapshots of the rotation dynamics of graphene flakes in DI water according to certain embodiments of the present disclosure.

FIGS. 6A-6H illustrate the field patterns induced by magnets in suspensions of between 0.01 wt. % to 0.2 wt % of graphene flakes in DI water as fabricated according to certain embodiments of the present disclosure.

FIG. 7B illustrates the longitudinal magnetic field $B_z$, applied vertically to the surface of the graphene flakes, and FIG. 7C shows the absolute value of the transverse magnetic field $B_\perp$, both applied at about 1 mm from the magnets for samples fabricated according to certain embodiments of the present disclosure.

FIGS. 9A-9D illustrate the orientation dependent relative optical transmission and reflection of graphene flakes where spectra are not normalized to the incident white light, fabricated according to certain embodiments of the present disclosure.

SUMMARY

Figure 1G:
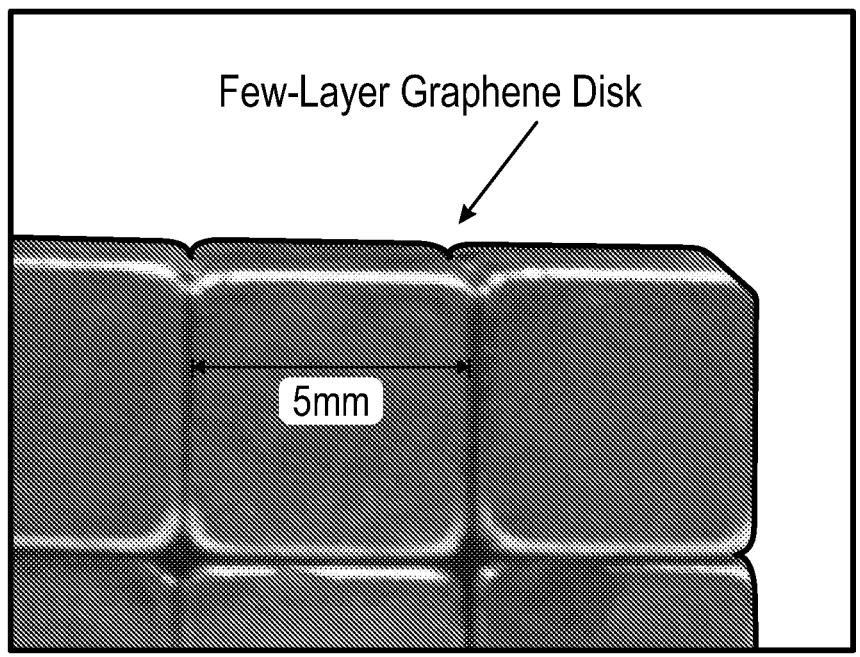

In an embodiment, a method for orienting a plurality of particles, comprising: applying, to a suspension of a first component and a second component encased in a receptacle, a first magnetic field of a first intensity from a first direction relative to a first plane when the suspension is in proximity of a predetermined measurement area, and wherein the second component comprises at least one 1-dimensional or a 2-dimensional material; orienting, in response to the application of the first magnetic field, a plurality of particles the second component in a predetermined orientation relative to the first plane; and determining, based on the orientation response, a plurality of characteristics of the magnetic field. In an embodiment, the method further comprises forming the suspension by using a first component comprising at least one of deionized water, a basic solution, an acidic solution, or a polymer. In the method, the second component comprises a 1-dimensional or a 2-dimensional material and that is present in the suspension from about 0.01 wt. % to about 4.0 wt. %. In some examples, the second component comprises graphene, graphite, carbon nanowires, carbon nanorods, or carbon nanotubes, and wherein the second component does not comprise magnetic nanoparticles, paramagnetic nanoparticles, or impurities. In the example, the embodiment further comprises forming the suspension using the second component wherein a plurality of particles of the second component are from about 0.4 nm to about 100 nm in diameter, forming the suspension using the second component wherein a plurality of particles of the second component are from 0.3 nm to about 100 nm thick. In some embodiments, the method further comprises forming the suspension wherein the second component comprises a plurality of graphene particles from about 0.5 μm to about 50.0 μm in maximum diameter and from about 0.4 nm to about 100 nm in thickness. Further in an embodiment of the method, applying the first magnetic field of the first intensity further comprises applying a rotating magnetic field, wherein an angle of the first magnetic field with respect to the first plan changes over a predetermined period of time relative to the first plane, wherein the plurality of particles changes orientation in response to receiving the rotating magnetic field during the predetermined time such that the plurality of particles mirror a motion of a changing direction of the magnetic field. In an embodiment of the method, the second component comprises two or more one-dimensional or two-dimensional materials such that a first material of the second component is oriented in response to the first magnetic field and causes a second material of the second component to change its orientation. Furthermore in this embodiment, subsequent to orienting the plurality of particles, the method comprises modifying the first component, wherein modifying the first component comprises removing or solidifying the first component.

In an embodiment of the present disclosure, a device comprising: a suspension disposed in a vessel, wherein the suspension comprises a first component and a second component, wherein the second component comprises a plurality of particles comprising at least one 1D or 2D material, wherein, in a first state, at least some particles of the second component comprise a first orientation relative to a first plane, and wherein the at least some particles of the second component are configured to, in second state, responsive to a magnetic field, change from the first orientation to a plurality of subsequent, orientations that are different from the first orientation in response to a different magnetic field. Further in this embodiment, in the second state, the other particles of the second component change from the first orientation to the plurality of subsequent, different orientations in response to the change in orientation of the at least some particles, and the at least some particles are in contact with the other particles to cause the orientation change in the other particles, and the at least some particles comprise graphene, and wherein the other particles of the second component do not comprise graphene.

A device comprising: a plurality of particles comprising graphene disposed in a vessel, wherein, in a first state, the graphene particles comprise a first orientation relative to a first plane, wherein the plurality of particles does not comprise magnetic particles or paramagnetic parties, and wherein the plurality of graphene particles are configured to, in second state, change from the first orientation to a plurality of subsequent orientations that are different from the first orientation in response to a magnetic field. In this example, the plurality of oriented graphene particles disposed in a suspension comprising dionized water or polymers. In an embodiment of the device, the plurality of graphene particles comprises a plurality of first dimensions, and a second plurality of particles disposed in the vessel or in a second vessel, wherein the second plurality of particles comprises a plurality of second dimensions, wherein at least one dimension of the plurality of second dimensions is different than the at least one dimension of the plurality of first dimensions. Further in this example, the magnetic field comprises a strength from about 0.1 to about 1.0 T and is applied in one or more angles relative to a plane.

DETAILED DESCRIPTION OF THE DISCLOSED EXEMPLARY EMBODIMENTS

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

As one-dimensional (1D) and two-dimensional (2D) materials continue to be a focus of development across various industries, the control, manipulation, and commercial viability of use of these materials is explored. Materials may be referred to in various manners, including zero-dimension, 1D, 2D, and three-dimensional (3D) materials. Zero-dimensional materials may be those that contain isolated nanoparticles, for example, when nanoparticles that may be 1D, 2D, or 3D, materials are in solution or suspension and are not in contact with other particles of the same type. 1D materials may include nanofibers or nanorods or other nanotubular materials with a length of over 100 nm and a diameter of less than 1000 nm. 2D materials may be materials such as graphene, graphite, sheet silicates, or other materials that self-assemble, and/or those materials that have a two-dimensional single layer of atoms, and which have a thickness of less than 1000 nm but which may have other dimensions that exceed 1000 nm. 2D materials may present in the form of films and coating as well as individual particles such as the graphene flakes and particles discussed herein. 3D materials may include those materials that are combinations of 0D, 1D, and 2D materials, and may be described as polycrystals, powders, consolidated materials, or bulk materials. A "flake" of material, as opposed to a particle, may be the term used to describe a structure resulting from exfoliation or another method of reduction, that is, a flake of a material is a particle such as a sheet or a nanoplate of the material that occurs upon cleaving or other separation method that may be tuned to fabricate flakes of a target size (length, width, and/or thickness).

In some examples, it may be desirable to orient a plurality of particles of these materials, for example, graphene and graphite flakes and particles, carbon nanostructures such as nanotubes, nanowires, and nanoparticles of various random and engineered shapes, such that the particles are oriented in a manner that creates a functional, macroscopic object. This may be the case for magnetic sensing, where the suspension(s) discussed herein are used in one or more chambers of a device to determine a location, intensity, and direction(s) of a magnetic field. In some examples, a final product may be fabricated via the systems and methods discussed herein, and in other examples, the systems and methods discussed herein may be employed in measurement and monitoring devices in safety, environmental, regulatory, and/or quality control application. Examples of products that employ oriented 1D and 2D materials may comprise magnetically controlled displays (televisions, GUIs, other displays and screens that may or may not be touch-sensitive). When a plurality of magnetically ordered nanomaterials are oriented, the resultant macroscopic structure may possess various optical, desirable electrical, and electronic properties of the combination of the single particles (flakes, carbon nanotubes (CNT), etc.). In one example, properties of individual particles may be expanded to an entire wafer (silicon or otherwise), and in some examples, the particles such as graphene flakes may exhibit a desirable birefringence that may be used in applications for displays (graphical user interfaces) and electo-optic switching.

When a plurality of 1D or 2D materials (or both) are aligned in the same planar direction relative to a static coordinate system, the plurality of aligned flakes exhibit commercially desirable thermal, optical, electrical, and electromagnetic shielding properties. This macroscopic orientation or nanomaterials may be achieved via the application of at least one of shear stress, electrical fields, or magnetic fields. Conventional mechanical alignment may be limited by the degree of control and the relative size of the product employed in applications, and magnetic and/or electrical field alignment may be used alone or in combination in various fabrication methods of devices.

Discussed herein are systems and methods using a high diamagnetism of exfoliated graphene, and, more specifically, the orientational response of two dimensional (2D) to one or more applied magnetic fields. That is, the response of exfoliated graphene, graphite, and other 2D materials to magnetic fields may be to rotate in one or more direction, and that orientational response may be generated and employed as discussed herein. High anisotropic optical transmission and reflectivity of graphene flakes were illustrated via the simulations and experiments discussed herein. By combining macroscopic alignment with anisotropic optical property of graphene, several device applications of graphene in magnetic field sensing and magnetic field controlled display are also discussed herein. Magnetic alignment is safer and less invasive than electrical alignment, especially for non-magnetic materials in conductive solvents. By mixing graphene with other nanomaterials, it is possible to align composites with a magnetic field. A "complete" alignment of graphene flakes can also be achieved using a rotating magnetic field, where a complete alignment is an alignment sufficient to cause the aligned material such as graphene flakes or other 1D or 2D materials to exhibit a macroscopic property. A rotating magnetic field is a field which is applied at the same or differing strengths from a first position relative to a static coordinate system to a second, different, position relative to the same static coordinate system. The electrical control of orientation may be realized using micro-electromagnets that generate fields as low as 0.1 T. The use of graphene and other 1D and 2D materials as discussed herein enables a tool to control these properties with external field, and enables the assembly graphene into macroscopic objects that preserve the excellent microscopic properties of graphene.

Using the systems and method discussed herein, nanostructured 1-dimensional (1D) and 2-dimensional (2D) materials may be oriented in a controllable fashion and assembled into functional macroscopic objects because the properties of low-dimensional materials are intrinsically anisotropic and adherent to their atomic structures. Unique properties of individual nanostructures may be utilized and transformed to large-scale macroscopic functions when the nanostructures are arranged in a macroscopic order. Macroscopically ordered nanomaterials have many benefits in device applications that randomly oriented flakes may not have due to the respective properties, properties that may be typically found in larger materials or materials comprising magnetic or other types of nanoparticles in addition to the nanomaterials such as graphene, graphite, or carbon nanotubes (CNT). For example, by aligning billions of single wall carbon nanotubes or nanowires in one direction, optical, electrical and electronic properties of single CNTs can be expanded to cover a surface of a wafer that may comprise silicon, glass, polymers (such as UV-curable polymers), metallic, or other materials or composite materials. A collective response and alignment of graphene oxide flakes exhibits birefringence, and has found applications in display and electro-optic switching.

As discussed herein, when a plurality of 1D or 2D materials such as graphene flakes are assembled in the same planar direction, they show excellent thermal, optical, electrical and electromagnetic shielding properties. These macroscopic orientation orders of nanomaterials may be obtained with three techniques: mechanical shear stress, electrical fields or magnetic fields. Mechanical alignment is an old and general method that can be applied to almost every nanomaterial, but the control by a magnetic or electrical field offers more flexibility and is more suitable for device applications. Magnetic or electrical field alignment of most nanomaterials such as CNT, graphene flakes, or 2D transition metal dichalcogenides has been achieved, but similar alignment of graphene remains a challenge. The use of graphene and graphite herein is the use of pure graphene or graphite, in contrast with graphene oxide or materials that have other nanoparticles and/or magnetic particles or nanoparticles dispersed throughout. The alignment, orientation, and magnetic response(s) discussed in the systems and methods herein are thus achieved using pure graphene, graphite, and other 1D and 2D materials that do not contain magnetic, paramagnetic, or additional materials.

Diamagnetism is a ubiquitous property of materials due to magnetic response of orbital electrons. Diamagnetism has been used to align non-magnetic nanomaterials, but a large field is typically used (where a large field may be greater than 1 Tesla (T)) that may be expensive to generate or unsafe for equipment and personnel. As defined herein, a "pure" material is one without impurities or additional (intentional) inclusion of nanoparticles of other materials such as those materials that may have been previously employed in combination with 2D materials to induce or encourage magnetic response. As examples of novel device applications, graphene flake suspensions can be used for magnetic field sensing and magnetically controlled displays for fields as small as 0.01 T, and in other examples the field may be as small as 0.05 T. In some examples, the magnetic responses (orientational responses) discussed herein may be in response to a magnetic field from about 0.1 T to about 1 T.

In a first set of examples, two types of graphene flakes were prepared. The first type of flakes may be referred to as "few-layer" graphene flakes, or "thin" graphene flakes, which were obtained via electrochemical exfoliation of HOPG. The "thin" graphene flakes ranged from 1-3 layers each, and, in some examples, each layer is from 0.1-0.7 nm thick with a thickness range from 0.1-2.1 nm thick. In an example with thin graphene flakes, each flake is from 2-6 μm in (maximum) diameter, as measured perpendicular to the thickness. The second type of flakes prepared and discussed herein are referred to herein as, "multi-layer graphene flakes," with average thickness of 2.4 nm. Both types of flakes were synthesized via intercalation and exfoliation of graphite. Graphene flakes were dispersed in either de-ionized (DI) water, the results of which are shown in FIGS. 2, 3, 6A-6H and 10A-10CD or in N-methyl-2-pyrrolidone (NMP), the results of which are shown in in FIGS. 1 and 8A-8D. Magnetic measurements were obtained using a Lakeshore 735 vibrating sample magnetometer.

In an embodiment, the sample preparation comprises: using HOPG (EYGS121803) with thickness of 25 μm from Panasonic Electronic Device Co., Ltd. Few-layer graphene flakes were fabricated by electrochemical exfoliation of HOPG and multi-layer graphene flakes were provided by Ningbo Morsh Technology Co., Ltd with intercalation and exfoliation of natural graphite flakes. The graphene writing board cell consists of two glasses was sealed with 1 mm PDMS and filled with 0.1 wt % graphene NMP dispersion.

The magnetic curves of graphene were measured by using Lakeshore 735 vibrating sample magnetometer with dried graphene laminates mounted to the probe. The Fe impurity concentration in multi-layer graphene flakes was measured with a Perkin-Elmer Optima 2100 Inductively Coupled Plasma-Atomic Emission Spectrometry (ICP-AEM); A Varian 810 ICP-MS (mass spectroscopy) was used to analyze few-layer graphene samples.

FIGS. 1A-1F illustrate the diamagnetic susceptibility and magnetic field induced birefringence of graphene flakes dispersed in N-methyl-2-pyrrolidone (NMP). Graphene flakes were then dried and laminated for diamagnetic susceptibility measurement. FIG. 1A shows the magnetization curves of the two types of flakes when the magnetic field is perpendicular to the flakes' surfaces. Diamagnetic susceptibilities of $0.31 \times 10^{-4}$ emu/g/Oe for few-layer graphene flakes and $0.23 \times 10^{-4}$ emu/g/Oe for multi-layer flakes were obtained. The susceptibility of the few-layer graphene flakes is higher than those of original HOPG ($0.05 \times 10^{-4}$ emu/g/Oe) and reported single layer graphene. Such a high susceptibility indicates the high quality of graphene flakes which is desirable for the magnetic alignment of the flakes' orientations.

When the surface of a diamagnetic graphene flake is oriented perpendicular to an external magnetic field, the induced magnetic field is in a direction opposite to the external field, leading to repulsive magnetic force and increased total interaction energy. In order to minimize the magnetic potential energy, the flake will rotate away from the field until its surface is in parallel with the external field. To detect the magnetic response of few layer graphene, the birefringence of the liquid suspension was monitored. This technique probes the orientations of liquid crystal molecules as well as layered 2D nanomaterials.

FIG. 1B is a schematic illustrating the experimental setup where a horizontal magnetic field through graphene suspension in a cuvette is generated by permanent magnets. The magnetic response can be clearly seen from the change of the birefringence in the transmission images of FIGS. 1C-1F. The alignment of graphene along the magnetic field is confirmed by the observations that the transmission is stronger in FIG. 1D when both polarizers are 45 degrees relative to the magnetic field of 240mT but becomes weaker in FIG. 1F where one polarizer is parallel to the field and the other is perpendicular to the field. FIGS. 1C and 1E show almost no difference when no magnetic field is applied.

Figure 1H:
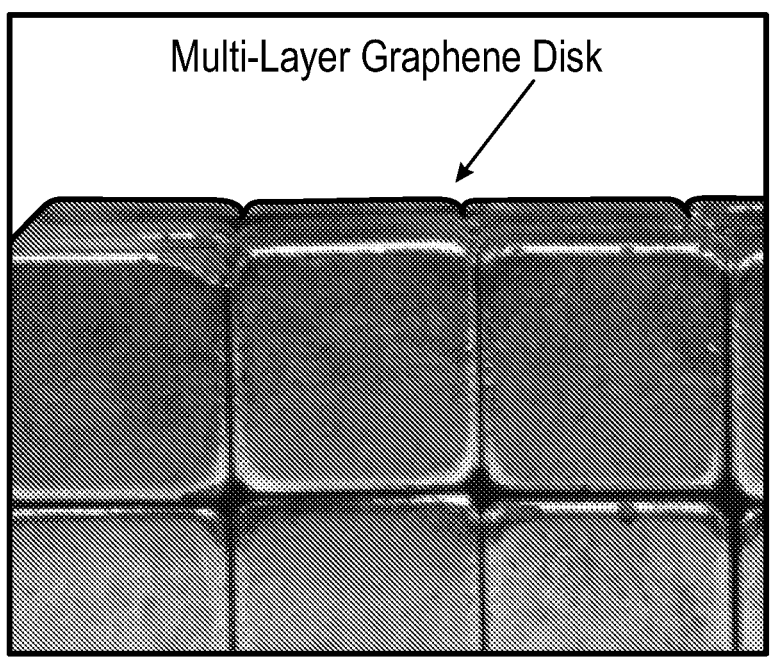

FIGS. 1G and 1H illustrate magnetic levitation according to certain embodiments of the present disclosure of few-layer (FIG. 1G) and multi-layer graphene (FIG. 1H). The graphene disks were prepared by drying their liquid suspensions as shown in FIGS. 1A-1F for few-layer graphene and FIGS. 2A-2I for multi-layer graphene.

FIGS. 2A-2I illustrate pictures and schematics of the magnetic response of flakes of the multi-layer graphene flakes by using suspension of multi-layer graphene flakes in DI water in a plastic beaker and placing magnets directly below each suspension. FIGS. 2A-2C show pictures of the graphene flake and DI water suspensions with 0 (2A), 1 (2B) and 2 (2C) bar magnets below the samples. The magnetic response of graphene suspension can be immediately recognized by the bright-dark patterns created by magnets, that is, the area right above the magnet surface remains dark, but the edge and surrounding regions of the magnets become bright.

To determine the orientation of the flakes in these regions and understand the underlying mechanism, an optical microscope was used to take images of selected areas of a diluted suspension. FIGS. 2D-2F illustrate the images taken of the suspensions. FIG. 2D shows the randomly oriented flakes of FIG. 2A, and FIG. 2E shows the picture of graphene flakes in the center dark region in FIG. 2B, narrow and dark images of flakes indicate that they are vertically oriented. FIG. 2F shows that the flakes in FIG. 2C are horizontally oriented, with some flakes even becoming parallel to the liquid surface and giving shiny specular reflections.

Based on these observations and the magnetic field pattern of permanent magnets, that graphene flakes were aligned with the magnetic field, and orientations of flakes in three cases are illustrated in FIGS. 2G-2I when fields of 0mT (2G), 150mT (2H), and 100mT (2I). Around the middle of two magnets, the magnetic field and flakes are oriented horizontally. The reflection is relative high in this case by horizontally oriented flakes. When the flakes are oriented vertically, the reflection is low as the light is transmitted and scattered among flakes. In the initial suspension, flakes are randomly oriented. The orientation dependent dark to bright contrast is similar to the flakes of graphene oxides reported by the authors before, which will be further explained in the text later. Magnetic alignment is completed when field passes through the surface of a flake, but the orientation of the flake is not totally fixed, and it can still rotate around the field direction. Because of this, some flakes in FIG. 2F exhibit bright specular reflectance but many other flakes are not parallel to the surface, which still appears dark from the top view (2B).

To better understand the dynamics of flakes under magnetic field, the orientation of a multi-layer graphene flake was monitored in in real time. FIGS. 3A-3H comprise snapshots of the rotation dynamics of graphene flakes in DI water. It can be seen that the flake is initially laid flat at the bottom of the beaker. It was chosen for better imaging because a suspended flake is difficult to track and focus. FIGS. 3A-3D illustrate top-down snapshots of a graphene flake when a magnetic field of 24 mT is applied and FIGS. 3E-3H illustrate top-down snapshots of the graphene flake after the magnetic field is removed.

After the application of a 24 mT vertical magnetic field, the flake began to turn and finally stood up vertically on one of its edges, in alignment with the magnetic field. This flake must overcome the gravitational potential to turn and flip up, so a relatively strong field is required. After the removal of the field, the flake slowly returned to its original position in 10 seconds. While 24mT was employed in this example, higher magnetic fields, such as a magnetic field of 100 mT, the rotation can be done within 0.5 second. This field is much weaker than the 9T predicted by previously authored theoretical works, this activity in the presence of a 24mT field may be due to large size and mass of multi-layer flakes. For micro-sized few layer graphene, a weaker field of 10 mT may be employed in order to overcome thermal fluctuation energy at room temperature.

The magnetic alignment of diamagnetic flakes is similar to those of paramagnetic or ferromagnetic objects, however, the above magnetic alignment of graphene flakes are due to their intrinsic diamagnetic susceptibility rather than magnetic impurities such as Fe, which is the most abundant element in graphite or graphene. This conclusion is supported by the following discussions and new observations.

Figure 4A:
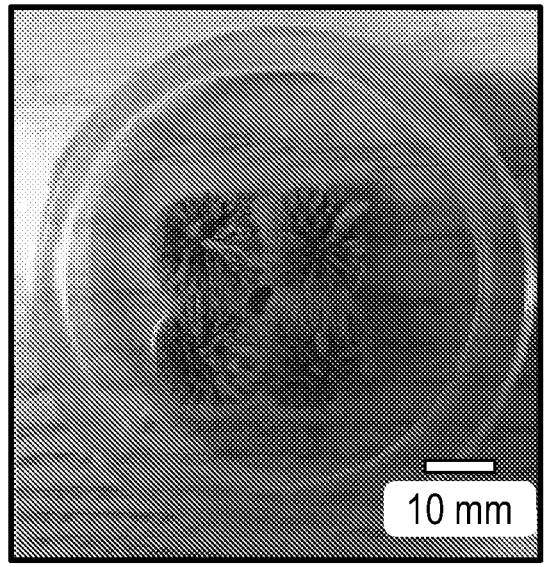
FIGS. 4A-4C are illustrations of arrangements of iron filings based on magnets oriented according to the configurations in FIGS. 6F, 6G and 6H, respectively according to certain embodiments of the present disclosure.
Figure 4B:
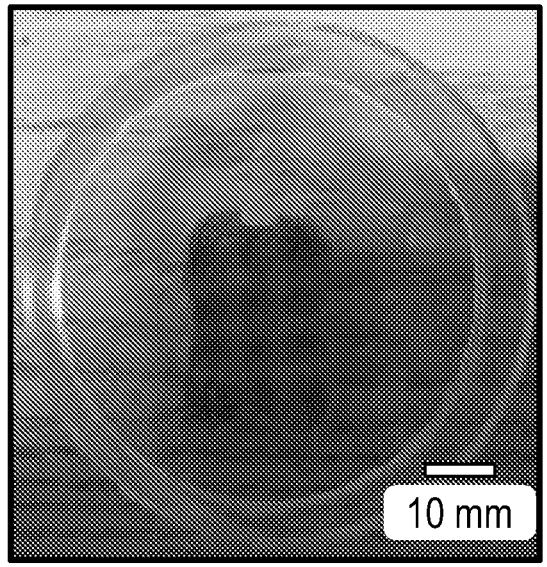
Figure 4C:
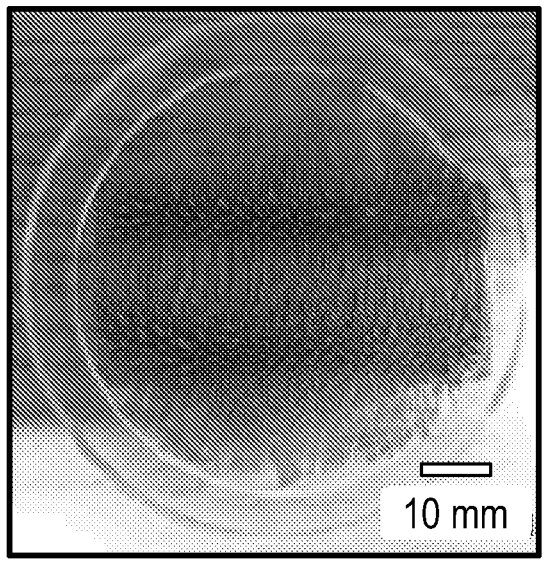
Figure 5A:
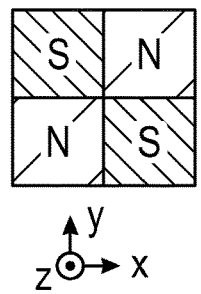
FIGS. 5A-5C illustrate the clean and strong diamagnetic susceptibility via the magnetic levitation of disks made of graphene flakes fabricated according to certain embodiments of the present disclosure.
Figure 5B:
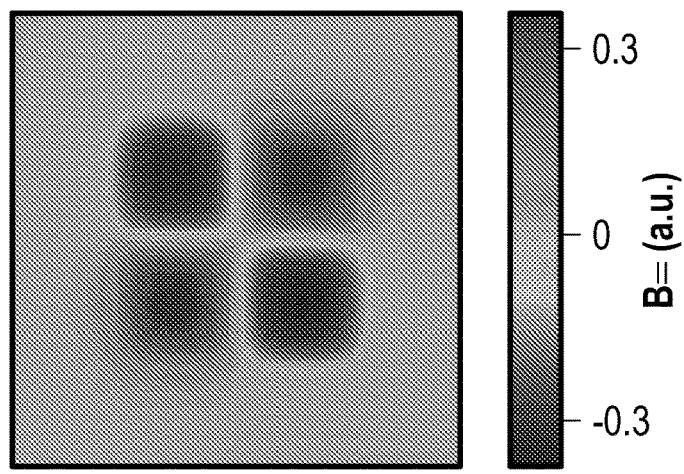
Figure 5C:
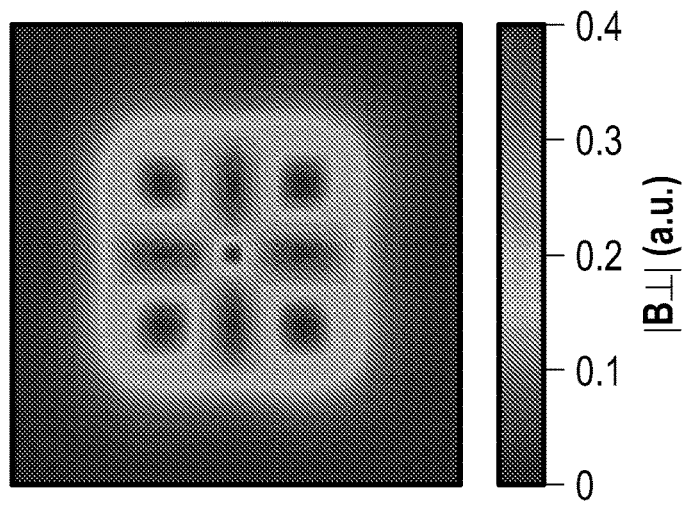
Figure 12A:
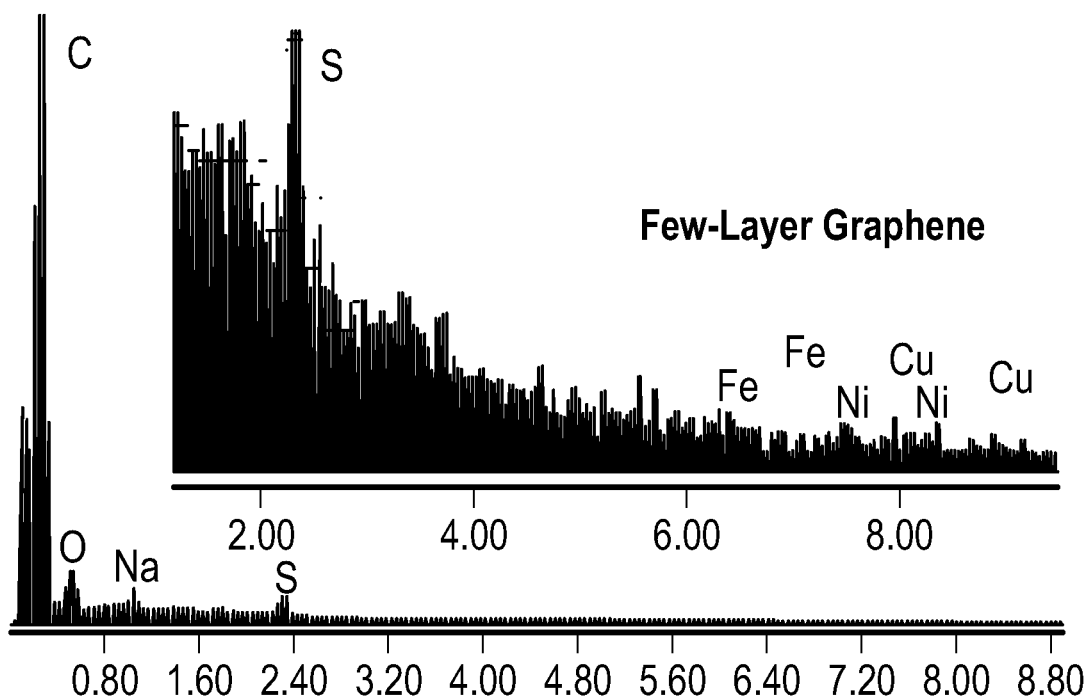
FIGS. 12A and 12B are energy-dispersive x-ray spectroscopy (EDS) measurements of iron impurity levels for graphene samples fabricated according to certain embodiments of the present disclosure.
Figure 12B:
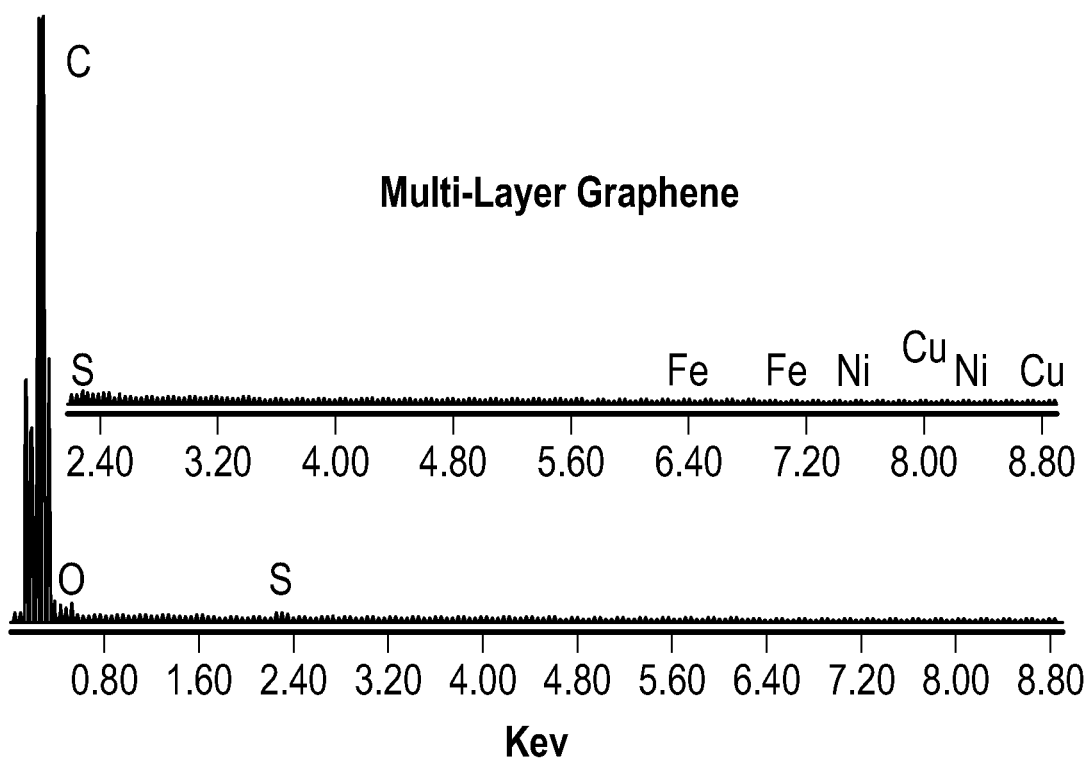

As shown in FIGS. 4A-4C using iron (Fe) filings for comparison to the graphene flakes, the magnetic impurity level in the samples fabricated according to embodiments of the present disclosure is too low to be detected by energy-dispersive X-ray spectroscopy (EDS), as illustrated in FIGS. 12A and 12B. The commercial software Comsol was used to simulate magnetic fields, as shown in FIGS. 5A-5C. The magnetic field on top of four magnets, as shown in FIGS. 4A-4C. The dimension of the magnets is 5 mm×5 mm×5 mm. The magnetic field was measured and studied at 1 mm above the four magnets. FIGS. 4B and 4C show the longitudinal magnetic field $B_z$ and the absolute value of the transverse magnetic field $B_\perp$, respectively. The magnetic field is mainly oriented vertically on top of the magnets. The magnetic field between two magnets is oriented horizontally. However, there is almost no magnetic field in horizontal direction in the middle of the four magnets. This simulation confirms the experimental observation of bright region between two magnets and the relatively dark spot at the cross of bright lines, as shown in FIGS. 6B, 6D, 6F, and 6G, discussed below. Turning back to FIG. 1A, the two magnetization curves indicate that the paramagnetic contribution is negligible for both graphene samples.

FIGS. 5A-5C illustrate the clean and strong diamagnetic susceptibility via the magnetic levitation of disks made of graphene flakes. FIGS. 5A-5C are simulations using different arrangements of magnets that show field strength in direction, when fabricating the graphene flakes discusses herein (or graphite or iron flakes) a first step may be to determine what field are present in the flakes and a second step may be to determine the dimensions/concentrations of the flakes that produce a desired effect. In contrast to those paramagnetic or ferromagnetic graphene flakes, the graphene flakes synthesized herein will not be attracted to magnets in all of the experiments. FIG. 5A illustrates a schematic of four magnets, FIG. 5B illustrates the longitudinal magnetic field $B_z$, applied vertically to the surface of the graphene flakes, and FIG. 5C shows the absolute value of the transverse magnetic field $B_\perp$, both applied at about 1 mm from the magnets.

Example Applications

In various embodiments, it may be determined what magnetic field is present in an application (use) of a device, e.g., properties such as the strength and direction(s) of a magnetic field in an application are determined, and, based on that information, at least the dimensions and concentration of graphene or graphite, or other 1D or 2D nanomaterials, desired to produce a predetermined orientation result may be evaluated.

Two example applications are discussed herein that are based on bright-dark patterns created by magnets in, for example, FIGS. 6A-6H and FIGS. 8B and 8C. These applications are measuring/monitoring devices that detect the presence and properties of am magnetic field, and displays that employ the suspensions and products of the suspensions (e.g., solidified or otherwise modified suspensions) discussed herein. Because of the sensitivity of graphene flakes to magnetic field, they may be employed as magnetic field sensors. The field direction and strength can be read directly from optical images. The bright scattering part in suspension represents a horizontal magnetic field, while black surface indicates a vertical magnetic field. FIGS. 2A-2C are examples of graphene suspensions, and in some embodiments, it may be desirable to determine an optimal concentration of graphene in suspension that will produce a target best bright to dark color contrast for a particular application.

FIGS. 6A-6H illustrate the field patterns of a set of magnets that are used in combination with suspensions of increasing graphene weight percentages in suspension from 0.01 to 0.2 wt % of graphene flakes in DI water. In other examples, a different first component may be used instead of water, and other 1D and 2D materials may be employed for the second component in addition to or instead of graphene flakes. In this example, for a concentration of 0.01 wt % (6A), the suspension is semitransparent, and the contrast is low, similarly to the concentration of 0.05 wt % (6B). The contrast improves with 0.1 wt % (6C), and no obvious improvement with 0.2 wt % (6D), so the concentration of 0.1 w % is chosen for next field sensing display (6D). The various concentrations discussed herein may be employed in different measurement and other devices.

FIG. 6E shows a photo of initial suspension without magnetic field, and FIGS. 6F-6H show the field patterns of different shapes and configurations of magnets. Polarizations of magnets are interleaved among nearby magnets. It can be seen that the field pattern resemble the configuration of magnets, but some subtle differences are also noticeable. For instance, in FIG. 6F, the boundaries between four circular magnets become straight lines; in FIG. 6G, only two center square patterns have the same size of actual magnets; all other patterns including those in FIGS. 6A, 6B, 6C, 6D, and 6E show expanded and distorted shape of magnets. In an embodiment, the desired concentrations and materials used for this orientation would produce a desired effect similar to that in FIGS. 6F and 6G, where the flakes reproduce the shape of the magnets. In an alternate embodiment, it may be desirable to have a skewed/non-mirrored pattern produced, as in the other examples FIGS. 6A, 6B, 6C, 6D, and 6E.

Figure 7A:
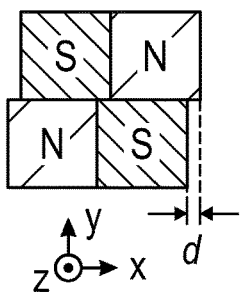
FIGS. 7A-7C illustrate a schematic of four magnets with a small shift of d=1 mm (7A)
Figure 7B:
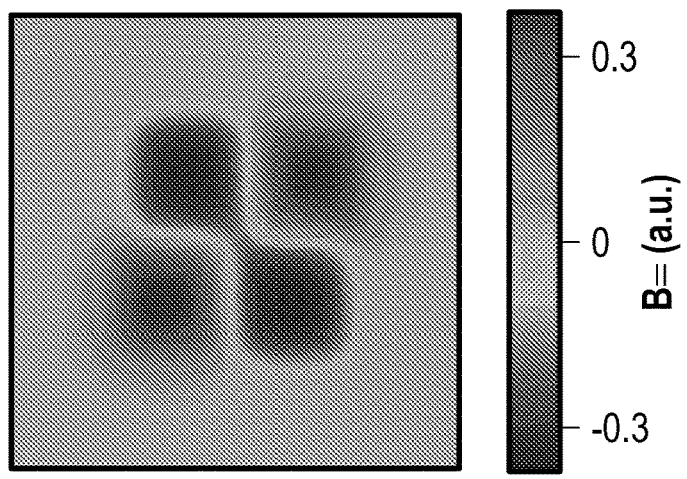
Figure 7C:
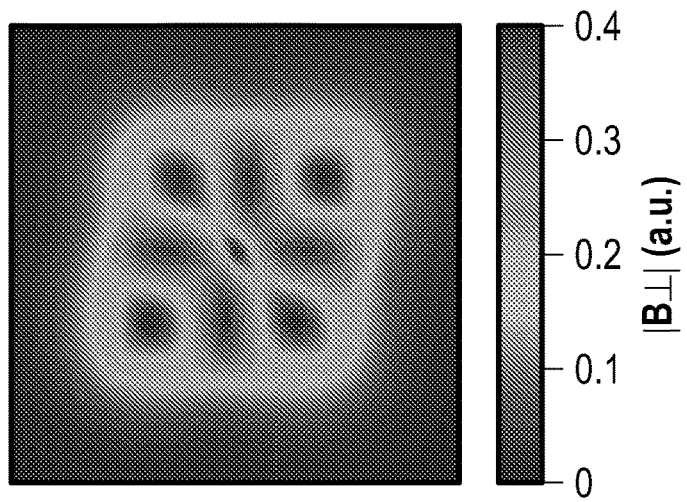

FIGS. 7A-7C illustrate a schematic of four magnets with a small shift. In particular, FIGS. 7A-7C illustrate a magnetic field when the four magnets are not perfectly aligned with each other (placed). A shift of 1 mm in x direction is applied to the two magnets as shown in schematic of FIG. 7A, where d=1 mm (7A), FIG. 7B illustrates the longitudinal magnetic field $B_z$, applied vertically to the surface of the graphene flakes, and FIG. 7C shows the absolute value of the transverse magnetic field $B_\perp$, both applied at about 1 mm from the magnets in the y direction. The patterns in FIGS. 7B and 7C reflect the actual distribution of the magnetic field. Because of the small size of graphene flakes, the graphene suspension is expected to provide higher spatial resolution than ordinary iron particles. This can be seen from the comparisons between patterns generated by graphene flakes and by iron particles in FIGS. 7A-7C. In this case, a small perturbation (FIGS. 7A and 7B) breaks the symmetry and the field pattern shows no symmetry in x or y direction (FIG. 7C). The red regions in FIG. 7C, which represent large transverse or horizontal field, show avoided cross pattern. This small feature can also be found in FIGS. 6A-6H and FIGS. 10A-10C.

In fact, graphene suspensions have revealed subtle and fine features of the field that cannot be detected by iron particles. For example, the crossing of two bright lines at the center of four magnet corners is not a simple superposition; instead, all the centers appear dark, not bright. The lines actually do not cross each other, two new branches around the centers will form. This reflects the fact that magnets are not arranged in a perfectly symmetric square lattice and that a magnetic field is a vector field without sources. In FIG. 6H, the center bright line is not as straight as the physical boundary of two magnets, indicates internal non-uniformity of the magnetization. In addition, the patterns are formed immediately without any efforts, while the patterns by iron particle require careful spray and shaking of iron particles. More graphene field displays and simulations of field patterns can be found in FIGS. 6A-6H, 8B-8D, and 10A-10C, as well as in the simulations in FIGS. 7A-7C.

Figure 8A:
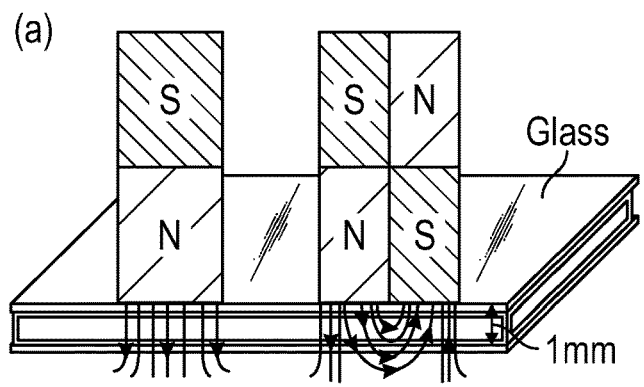
FIGS. 8A-8D illustrate an application comprising a display without polarizing optics, fabricated according to certain embodiments of the present disclosure.
Figure 8B:
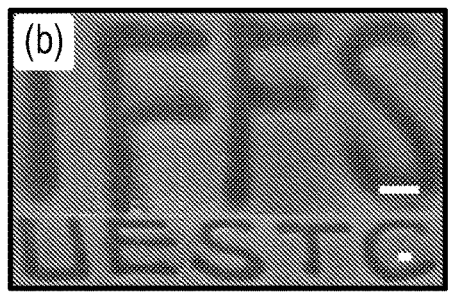
Figure 8C:
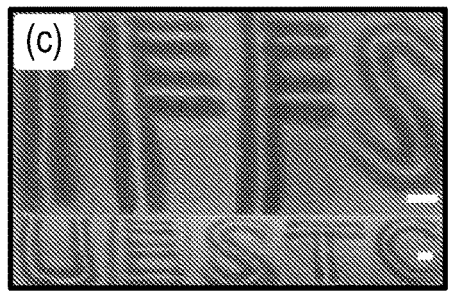
Figure 8D:
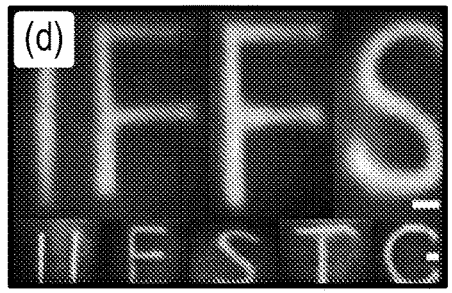

Another application is a display without polarizing optics, as shown in FIGS. 8A-8C. The display, for example a reflective display, offers enough contrast with ambient light, so no additional lighting is needed. Second, the display can be controlled by a magnetic field, which is a no-contact technique. The latter property allows the packaging of graphene suspension in a sealed window, and then using a magnet to create arbitrary patterns. FIG. 8A shows schematics of a graphene writing board and two methods that were used to write letters. Dark lines can be created by sliding a pole of a bar magnet on top of the writing board because it produces a magnetic field perpendicular to the board. A white line can be generated by the gap of two magnets because it produces horizontal magnetic field. FIGS. 8B and 8C show the letters "IFFS" and "UESTC" written by these two methods. The letters display the expected contrast, which is the same as in FIGS. 2A-2C. As demonstrated before, when transmission is imaged with back illumination, the dark letters appear bright, as shown in FIG. 8D.

Calculation of Orientation Dependent Transmission and Reflection

FIGS. 9A-9D illustrate the orientation dependent relative optical transmission and reflection of graphene flakes where spectra are not normalized to the incident white light, where "M." is used as the abbreviation for the word "magnetic." The examples used to generate simulation results in FIGS. 9C-9D are provided. The orientation dependent brightness of graphene flakes is a manifestation of its strong optical anisotropy. To obtain a quantitative understanding, the spectra was compared them with simulations. FIG. 9A shows the transmission spectrum of back-illuminated display cell with and without a vertical magnetic field. FIG. 9B shows the reflection spectra of graphene flakes with a vertical, horizontal and no magnetic field. The corresponding simulation results are shown in FIGS. 9C and 9D. The experimental transmission and reflection spectra on vertical magnetic field are directly copied to FIGS. 9C and 9D, so the ratios of different curves in FIGS. 9C and 9D were evaluated in the simulation.

Both the experiments and simulations reveal that transmission is strong but reflection becomes weak when flakes are vertically oriented. It is the opposite for flakes with surfaces perpendicular to the incident light. These observations and simulation results can be qualitatively understood from the relationship between the polarization of incident light and the graphene orientation. When the plane of a flake is perpendicular to the incident light, a large and uniform electron polarization is induced over the whole area of graphene, leading to the maximum absorption and reflection, hence minimum transmission. When a flake is vertically oriented as shown in the inset of FIG. 9A, the flake will appear as a carbon nanotube or nanowire as in FIG. 2E or 3D.

There are multiple examples of use of the methods and systems discussed herein, the use of which may depend on the polarization of incident light with respect to the graphene plane. When the polarization is perpendicular to the graphene plane, the absorption and reflection is negligible because of weak induced electron polarization, similar to that for a carbon nanotube or nanowire. When the polarization is aligned with the graphene plane, a larger electron polarization is induced, but the absorption and reflection is still weak due to a much smaller physical cross section. Hence, in both cases when flake is vertically oriented, the maximum transmission is achieved. The vertically and horizontally aligned flakes are two extreme cases, and randomly oriented flakes will have transmission and reflection in between.

After obtaining the transmission and reflection for one flake, a total transmission and reflection was calculated for the whole device from the top to the bottom including glass plates, as shown in FIG. 9A. The intensities of the transmission and reflection spectra are shown in FIGS. 9C and 9D. Since the light source spectrum was not modeled, the experimental transmission and reflection on vertical magnetic field was directly copied to FIGS. 9C and 9D. It was assumed that there are about 80 flakes floating in the liquid, which is equivalent to a total graphene thickness of 400 nm, in the light path between two glass plates. The horizontal and vertical magnetic field correspond to the flake orientation of $\theta=0°$ and $\theta=90°$, respectively. When there is no magnet field the flakes are randomly oriented, and the transmission and reflection were calculated using the average of the results from $\theta=0°$ to $90°$. Overall, there was agreement between the simulation data in FIGS. 9C and 9D and any discrepancies between the experiment and simulation may come from various sizes and/or numbers of flakes in the experiment.

Figure 10A:
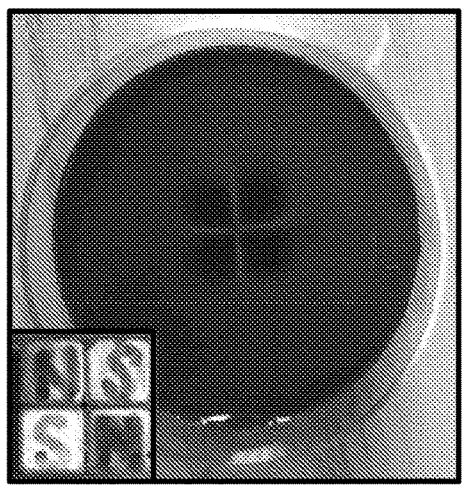
FIGS. 10A-10C illustrate a relationship between the graphene flakes' display pattern and an underlying magnet configuration for graphene samples fabricated according to certain embodiments of the present disclosure.
Figure 10B:
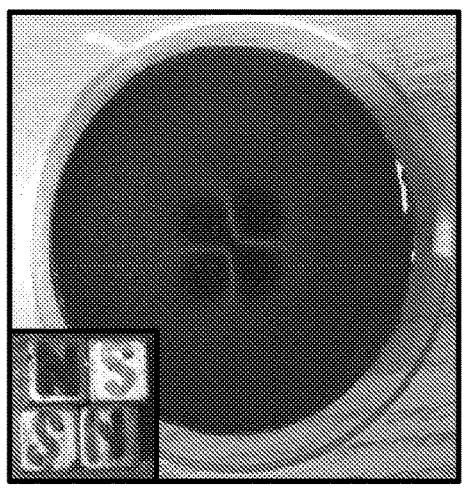
Figure 10C:
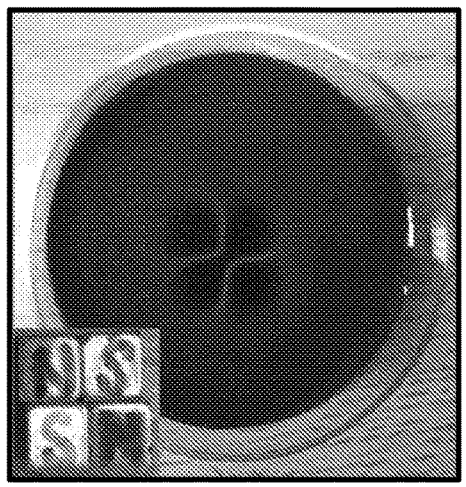

FIGS. 10A-10C illustrate a relationship between the graphene flakes' display pattern and an underlying magnet configuration. In FIG. 10A, the magnets are aligned, in FIG. 10B, the top set of magnets are offset to the right, and in FIG. 10C, the top set of magnets are offset to the left, as compared to those in FIG. 10A. The resultant patterns in FIGS. 10B and 10C show curves and less distinct lines than those of FIG. 10A. Thus, the orientation of the flakes follows the direction of application of the magnetic field as well as the strength/type of field applied which may be referred to as "mirroring."

Figure 11A:
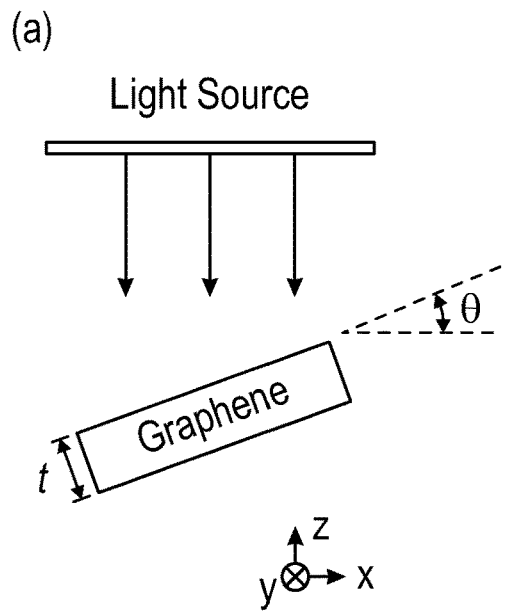
FIGS. 11A and 11B show reflection and transmission details about simulation configuration and polarization dependent reflection/transmission for samples fabricated according to certain embodiments of the present disclosure.
Figure 11B:
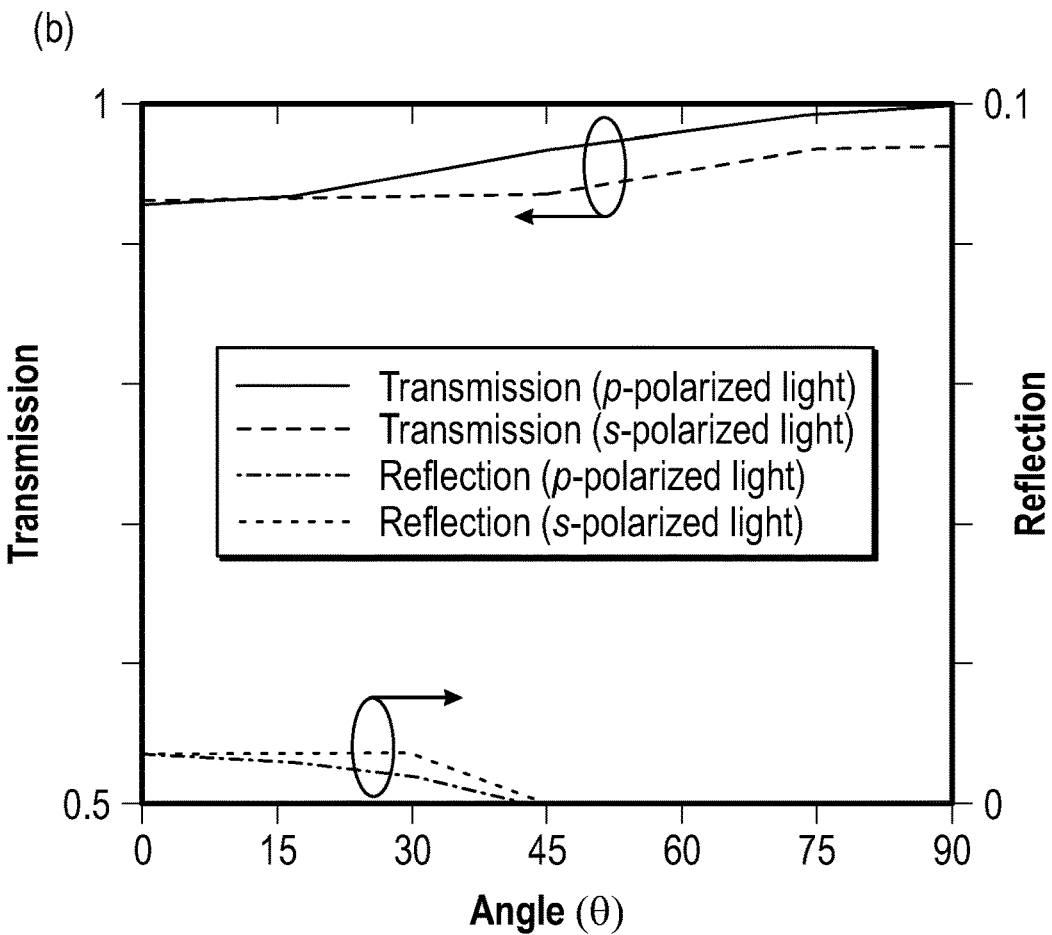

FIGS. 11A and 11B show details about simulation configuration and polarization dependent reflection/transmission. Finite-difference time-domain (FDTD) software from Lumerical was used to simulate the transmission and reflection of one graphene flake. FIG. 11A shows the schematic of the structure. The wavelength used in simulation is 600 nm. Refractive index of graphene is $n_{Graphene}=3+1.5i$. Graphene flakes are in the water, so the refractive index of the background is $n_{Water}=1.33$. Graphene dimension is 10 μm×10 μm×5 nm. The simulation window was set as 20 μm in both x and y directions. Plane-wave light source with both p and s polarization propagates in negative z direction. The graphene is tilted in an angle $\theta$ with respect to x axis. In the case when the graphene is tilted in an angle $\theta$ with respect to y axis, the results on p and s polarization will exchange. The transmission and reflection of a single flake is plotted in FIG. 11B. As shown in FIG. 11B, transmission increases as $\theta$ increases, because the cross section of the graphene flake decreases as $\theta$ increase. The reflection is very small due to the very thin thickness of graphene, t=5 nm.

FIGS. 12A and 12B are energy-dispersive x-ray spectroscopy (EDS) measurements of iron impurity levels. FIG. 12A illustrates the EDS measurement in the "few layer" graphene samples, and FIG. 12B illustrates the EDS measurement in the "multi-layer" graphene samples, according to certain embodiments of the present disclosure. The "C" graphs illustrate the carbon impurity level for both FIGS. 12A and 12B, and the "S" graphs illustrate the sulphur impurity level. As shown in FIGS. 12A and 12B, trace element analysis based on inductively coupled plasma (ICP) shows low Fe concentrations of 141.5 and 0.709 ppm for multi-layer and few-layer graphene samples, respectively, and it is noted that HOPG typically has a much lower impurity level than natural graphite.

Figure 13:
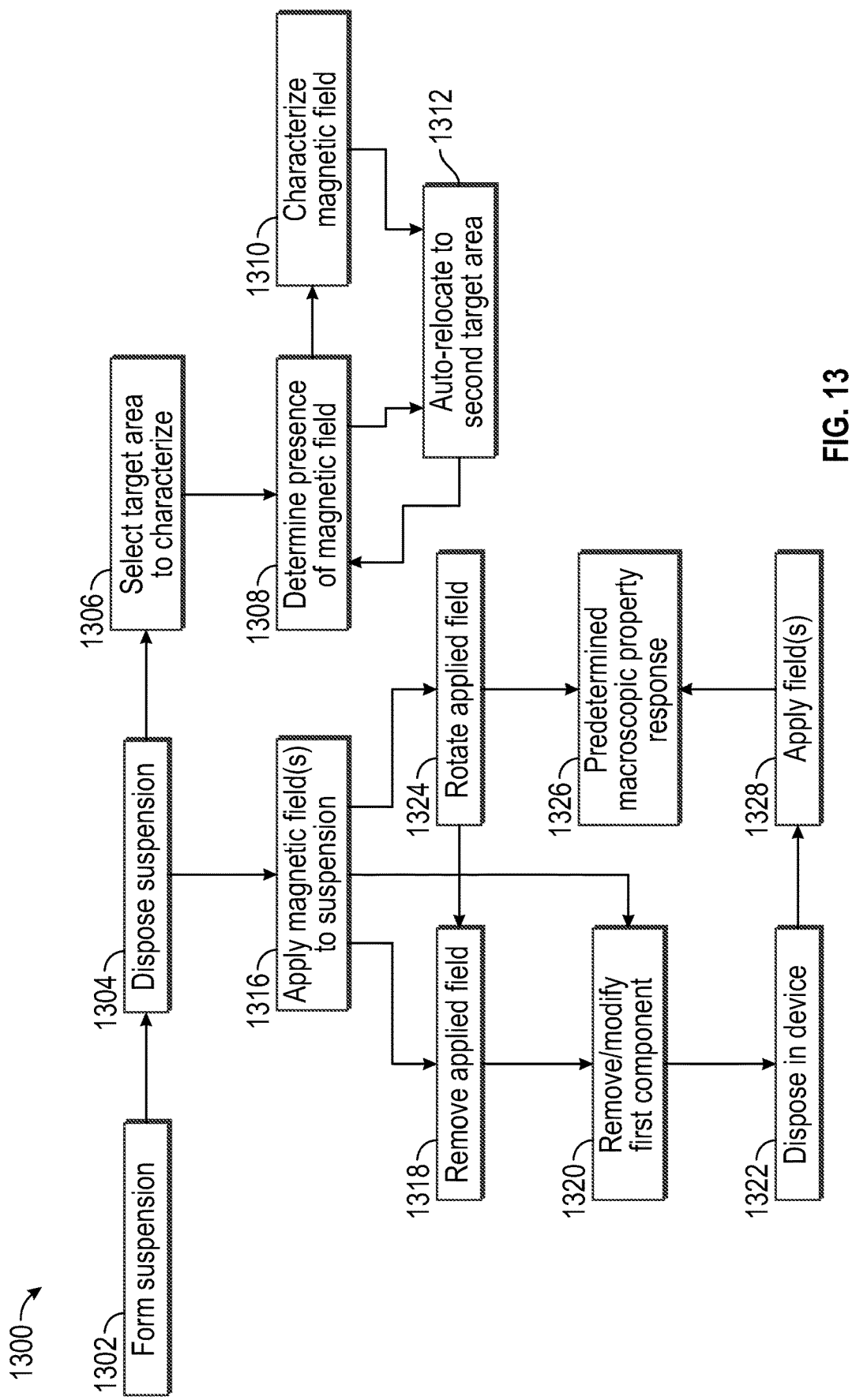
FIG. 13 is a flow chart of a method of fabrication and use of oriented 1D and 2D materials and devices thereof, according to certain embodiments of the present disclosure.

FIG. 13 is a flow chart of a method 1300 of using a plurality of oriented and orientable 1D or 2D particles, according to certain embodiments of the present disclosure. In the example method, at block 1302, at least one suspension may be formed. This suspension may comprise a first component and a second component, the first component may comprise a material such as water or a polymer, or other materials in which a plurality of 1D or 2D materials may be dispersed such that the particles may, in some instances, not be in contact with each other. In various embodiments, 1D and 2D materials may be employed in various combinations of size, shape, and concentration (relative to the other materials of the second component and to the first component) in a single vessel, such that a movement (response to magnetic field) of some of the particles of the second component may mechanically interact directly or via the medium of the first component to cause some or all of the other particles to also respond when a magnetic field is applied. In alternate embodiments, some or all of the particles may be in contact. In one example, the second component may be from about 0.01 wt % to about 8.0 wt % of the suspension and the first component may comprise the remainder of the wt %. In other examples, the second component may be from about 0.1 wt % to about 4.0 wt % of the suspension. In one example, a plurality of different types and/or sizes or concentrations of 1D and/or 2D materials of the second component may be employed such that a first material of the second component may be from about 0.01 wt % of the suspension to about 8.0 wt % and a second material of the second component, which may differ in concentration with respect to the suspension and, additionally or alternatively, differ in at least one dimension or particle shape (flake, nanotube, nanowire, nanorod, etc.). In examples where more than one material forms the second component, the two or more materials may be present in equal sizes and/or concentrations, or in unequal sizes and/or concentrations.

At block 1304, the suspension may be disposed in a device, for example, it may be encased in one or more vessels, and these vessels may be part of devices such as measurement equipment and/or magnetically-based displays, or other devices where an orientation of 1D or 2D nanoparticles creates commercially desirable macroscopic properties. At block 1306, a target area may be selected for evaluation. This may be the case where, for example, the suspension is disposed in a vessel that is used to determine a presence, intensity, and directionality of a magnetic field. The device employed that comprises the suspension, or a solidified component comprising the orientated particles as discussed at block 1320 and throughout, may be a static device mounted on a piece of equipment, movable cart, stationary wall, or other mechanism such that measurement of a target area or areas is enabled. In some embodiments, the device may further comprise a plurality of sensors configured to alert and/or adjust measurements and/or equipment functionality of the measured equipment based upon a measurement result.

In an embodiment, at block 1308, based on a reaction of the suspension, e.g., if the 1D and/or 2D particles of the suspension, a determination may be made as to a presence of a magnetic field. As discussed herein, the actions discussed in FIG. 13 in the method 1300 may be automatically executed by a processor of the device and are not manual actions taken by individuals. If a magnetic field is determined to be present at block 1308, it may be characterized at block 1310. This characterization at block 1310 may comprise a strength as low as 0.1 T in some examples, a directionality or range of directions (angle) over which the magnetic field is received, and a relative and/or average strength at various points, for example, in a rotating magnetic field.

At block 1312, the device may automatically relocate to a second target area that may or may not overlap with the first target area. This relocation at block 1312 may occur whether or not a magnetic field is determined to be present at block 1308, and may occur automatically in response to one or more of (1) a determination at block 1308 that no magnetic field is present; (2) a determination at block 1308 that a magnetic field is present; (3) a determination at block 1310 that one or more characteristics (properties) of the magnetic field detected at block 1308 meets or exceed a strength, time, and/or directionality threshold. If a magnetic field is detected at block 1308 after relocation at block 1312, the method 1300 may proceed to block 1310 for characterization. In various embodiments, the detection and characterization of the magnetic field(s) discussed in the method 1300 may be stored on the device and/or transmitted to a remote server for further analysis and characterization. At block 1314, based on the characterization of one or more magnetic fields at block 1310, an action may be executed. This action at block 1314 may comprise adjusting equipment located in the first or second target area, increasing a frequency of testing the first or second target area or adjacent areas, or an adjustment to a preventative maintenance schedule of equipment in the first or second target area or other adjacent areas.

In another example of the method 1300, the suspension may be used in a device that is not a measurement or a quality control device, for example, a device used for its magnetic display properties, electromagnetic shielding properties, optics, electrical, or thermal properties. In this example, the device may be fabricated at block 1302 by forming a suspension of a first component and a second component, similarly to what is described above. At block 1304, one or more suspensions formed at block 1302 may be disposed in one or more vessels of a single device. At block 1316, a magnetic field may be applied, and, in some embodiments, this application of a magnetic field may comprise application of a single field over a directional span (rotating field) at block 1324, and may be described as the application of one or more field strengths at various angles relative to a plane over a predetermined period of time.

In some examples, when the magnetic field is removed at block 1318, the first component may be removed or modified at block 1320. This may comprise removing a solvent or other liquid, gel, or other material from the suspension, and, in other examples, this may comprise modifying the suspension such that the first component is partially or completely solidified such that the oriented second component is "locked" into place. In this example, the component formed subsequent to solidification is such that the particles of the second component of the suspension will not further rotate in response to a magnetic field. Rather, the formed component, in response to a magnetic field, temperature, electrical current, electromagnetic force, and/or mechanical shear or tensile force applied at block 1328 exhibits a response comprising a predetermined macroscopic property. Thus, the systems and methods discussed herein may be employed to form components that may be used for various types of shielding, and that may be combined in various combinations of second component type/dimensions/concentration as discussed herein to form multi-layered shielding structures designed to protect other device components from damaging environments. Further, and as discussed herein, the systems and methods discussed herein may be employed in various combinations in measuring and monitoring devices that may be employed in various embodiments including manufacturing and testing environments in order to determine safety and/or efficacy of existing procedures.

In one example, a suspension of oriented 1D and/or 2D particles may be employed in an electrode, for example, as a film when a first component is removed and/or modified such that the first component solidifies sufficiently to "lock" the 1D and/or 2D particles into the desired orientation. This film may be adhered to an electrode via Van der Waals forces or other means. In another example, the suspension may be formed as such to be coupled (e.g., after solidification into a shape subsequent to magnetic orientation) to a substrate to provide electromagnetic shielding or shielding from thermal damage. This coupling may occur via an adhesive, epoxy, or via Van der Waals forces or other means. Thus, the modification discussed herein including at block 1320 of FIG. 13 may include modifying the suspension such that the first component is modified to form a shaped film or part that may be configured to mate with a substrate that is three-dimensional. That is, to couple to substrates that comprise curves, corners, and other transitions including material transitions. In some examples, more than one oriented material may be employed, and these materials may comprise varying compositions of first and second components, including the concentration of the second component in the predicate suspension.

Figure 14A:
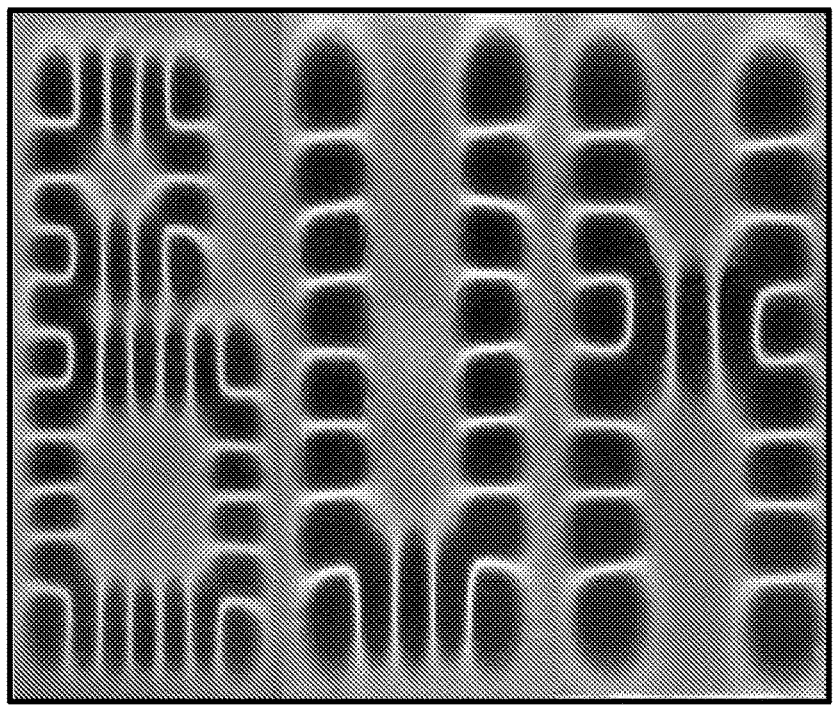
FIGS. 14A and 14B are optical images of an orientational response of materials according to certain embodiments of the present disclosure.
Figure 14B:
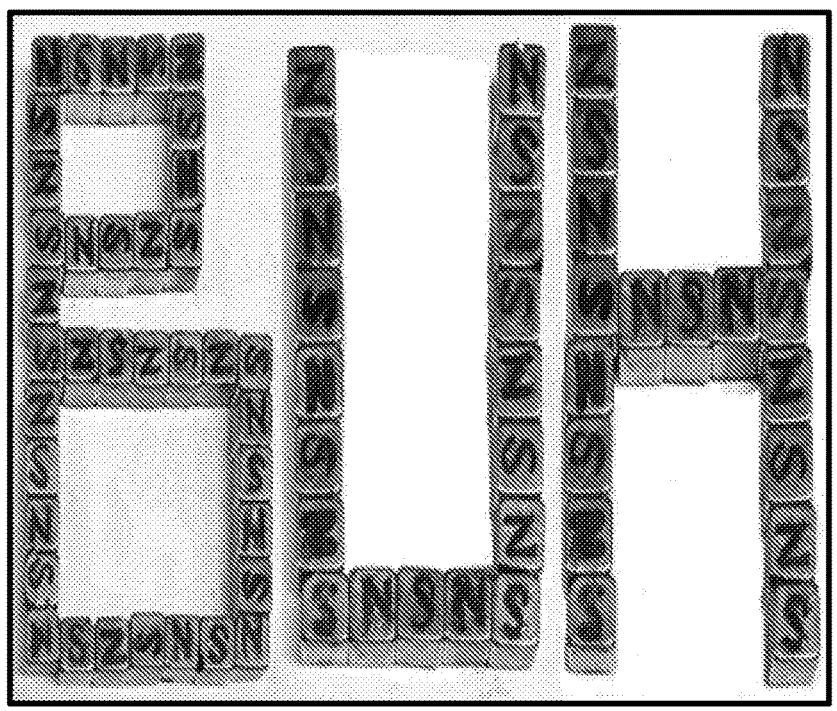

FIGS. 14A and 14B are optical images of an orientational response of materials according to certain embodiments of the present disclosure. A plurality of multi-layer graphene flakes that may be greater than 6 layers on average are illustrated in FIG. 14A suspended in deionized water and are oriented in response to the fields applied by the plurality of magnets of varying polarities in FIG. 14B.

Figure 15:
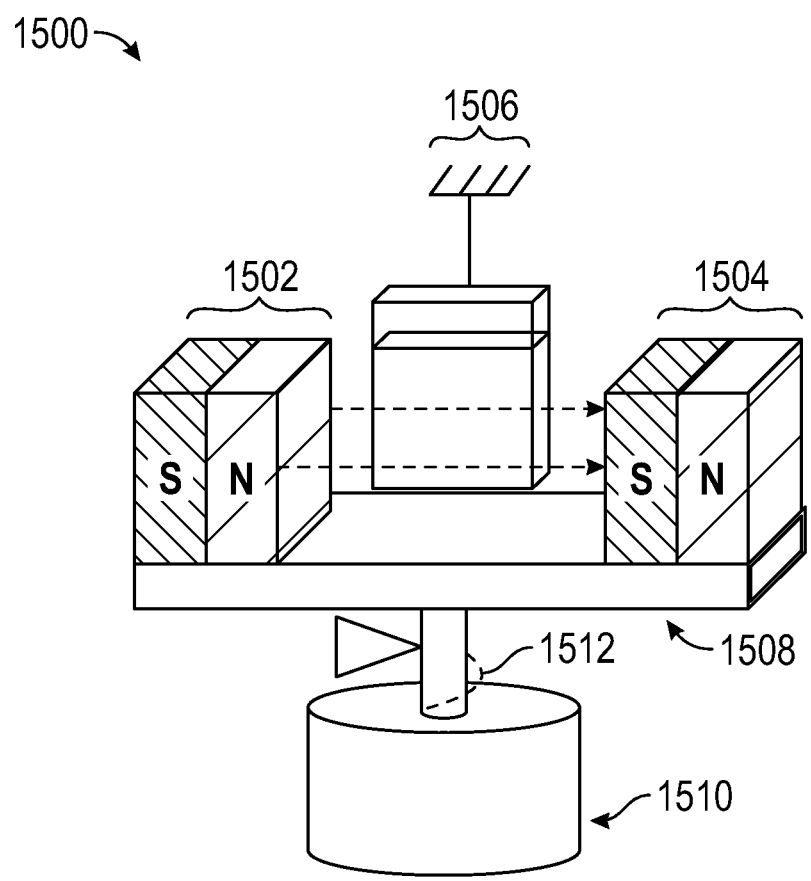
FIG. 15 illustrates an experimental setup of a rotating magnetic field employed for various measurements of the present disclosure.

FIG. 15 illustrates an experimental setup of a rotating magnetic field employed for various measurements of the present disclosure. FIG. 15 illustrates a rotating magnetic field system 1500 comprising a first pair of magnets 1502 disposed parallel and separated from a second pair of magnets 1504, both disposed on a stage 1506. A plurality of 2D or 1D materials may be dispersed in a second component which may be a liquid or a solid in the vessel mechanism 1506 that comprises a vessel and a stand, as discussed in FIG. 17A. The stage 1508 may rotate about the stand 1510 in a direction 1512 or a direction opposite 1512, or a combination of directions, thus causing the magnets 1502 and 1504 to rotate about the vessel mechanism 1506. This rotating magnetic field may cause various alignments and shifts in alignments of the 1D and/or 2D materials, as discussed above.

Figure 16A:
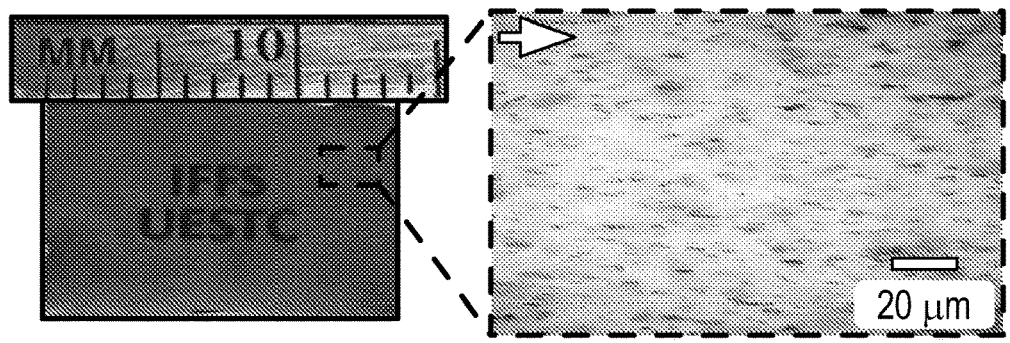
FIGS. 16A-16C are an optical image and SEM inset of magnetically oriented graphene flakes that were oriented according to certain embodiments of the present disclosure to act as a broadband optical polarizer and graphs of transmission results thereof.
Figure 16B:
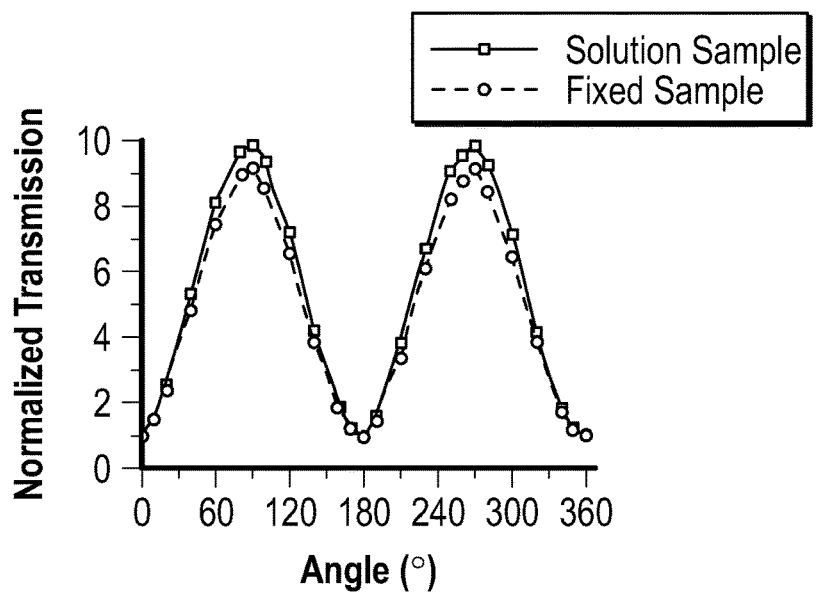
Figure 16C:
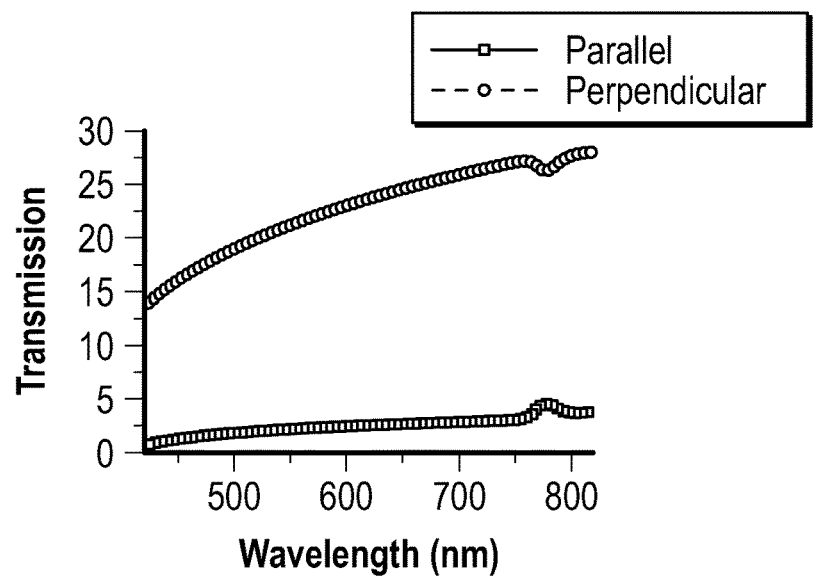

FIGS. 16A-16C are an optical image and SEM inset of magnetically oriented graphene flakes that were oriented according to certain embodiments of the present disclosure to act as a broadband optical polarizer and graphs of transmission results thereof. These graphene flakes of FIG. 16A were oriented and then the surrounding material, a UV-epoxy, was cured subsequent to graphene flake orientation to fix the flakes into position so that the material can act as a broadband optical polarizer. FIG. 16B is an optical characterization of the normalized transmission (using a fixed wavelength) with respect to the angle of between the graphene flakes and the electrical field. FIG. 16C is a graph of the transmission of light when an electrical field is applied at different wavelengths with fixed angles (0 and 90 degrees) with respect to the angle of between the graphene flakes and the electrical field.

Figure 17A:
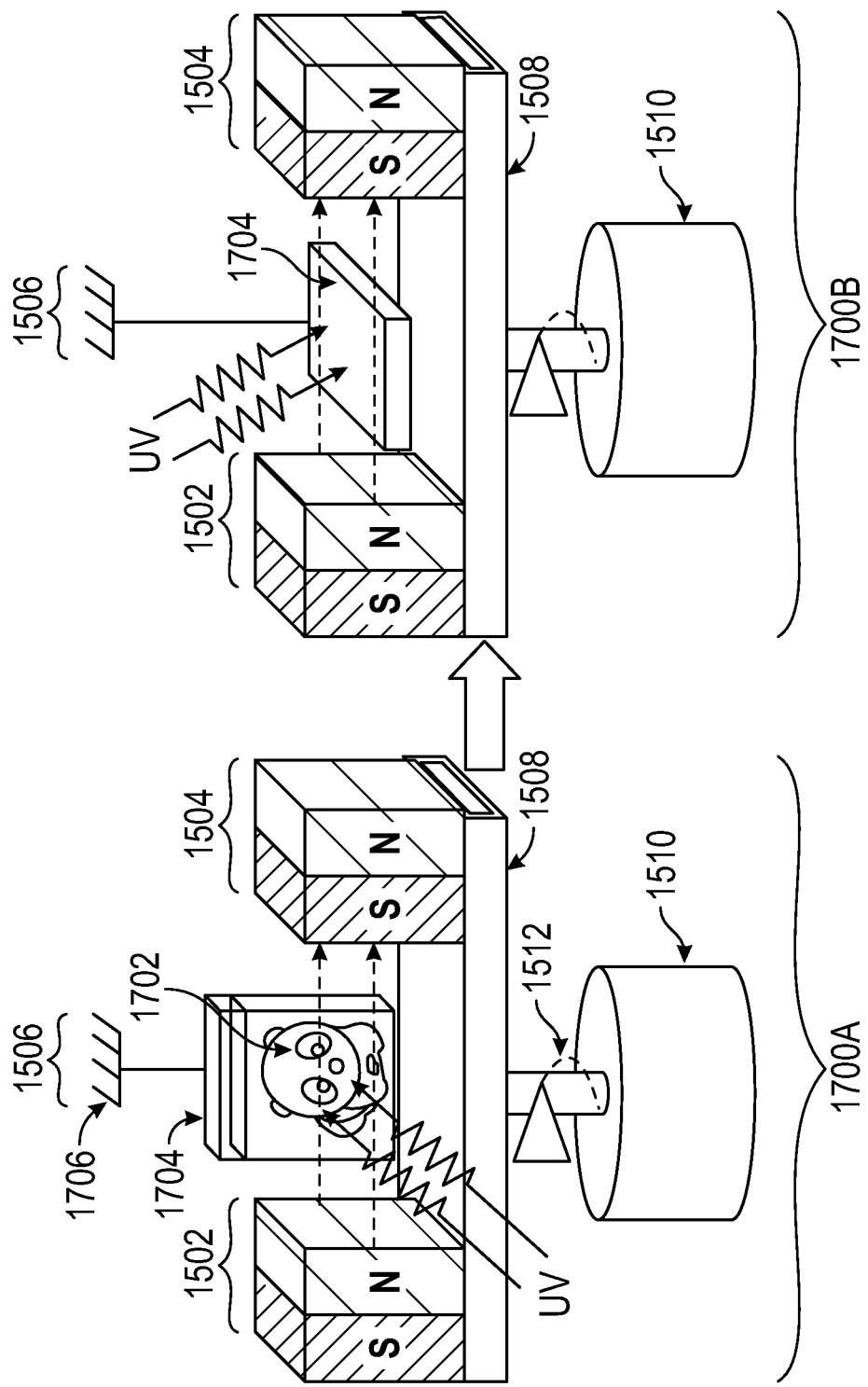
FIGS. 17A-17C illustrate an application of rotating magnetic fields and resultant transmission and reflection displays according to certain embodiments of the present disclosure.
Figure 17B:
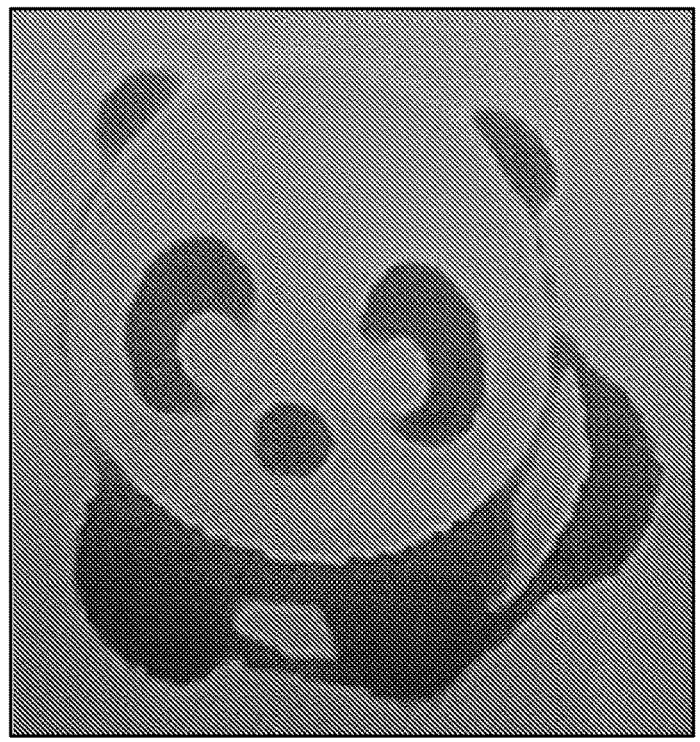
Figure 17C:
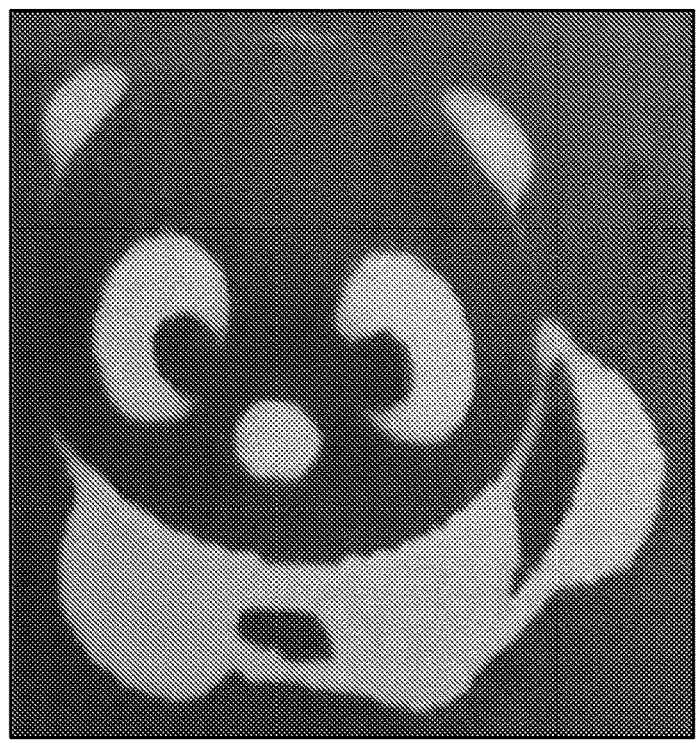

FIGS. 17A-17C illustrate an application of rotating magnetic fields and resultant transmission and reflection displays according to certain embodiments of the present disclosure. FIG. 17A is similar to FIG. 15 and illustrates a rotating magnetic field system 1700 in a first state 1700A and in a second state 1700B. In both states, the system 1700 comprises a first pair of magnets 1502 disposed parallel and separated from a second pair of magnets 1504, both disposed on a stage 1508. A plurality of 2D or 1D materials may be dispersed in a second component which comprises a UV-curable polymer such as a UV-epoxy in the vessel mechanism 1508. The stage 1506 may rotate about the stand 1510 in a direction 1512 or a direction opposite 1512, or a combination of directions. This rotating magnetic field may cause various alignments and shifts in alignments of the 1D and/or 2D materials, as discussed above.

FIG. 17A further illustrates a mask 1702 that may be fabricated via photolithography, the mask 1702 is removably coupled to at least one side of the outside of a vessel 1704 of the vessel mechanism 1506. The vessel mechanism 1506 additionally comprises a stand 1706 configured to support the vessel 1704 and enable the magnets 1702 and 1704 to generate a field and, in some cases, to freely rotate around the vessel 1704 while generating the magnetic field without contacting the vessel 1704. The plurality of graphene flakes are oriented using the magnets, either by rotation as shown in 1512 or by a stationary application of a magnetic field. This magnetic field is applied as to orient a least some of the graphene flakes or other 1D and/or 2D materials in the vessel 1704 to a predetermined orientation relative to one or more planes. The region not covered by the mask 1702, the exposed region, becomes cured via the UV light, as shown at 1700A, which solidifies the UV polymer and fixes the position of the graphene flakes in this exposed region on a side of the vessel 1704 where the mask 1702 was disposed. In response to this UV curing shown in 1700A the graphene flakes that are not covered by the mask are secured in place in the desired orientation. In some examples, a second UV curing of a second side of the vessel 1704, as illustrated in FIG. 1700B, is also performed.

Thus, when the mask 1702 is removed the graphene is oriented in different directions (as indicated by the shades in FIGS. 17B and 17C). FIG. 17B is an image of the component resulting from the curing at one or both of 1700A and 1700B in FIG. 17A. In particular, FIG. 17B shows light transmission during backlighting of the solidified component that remains when the magnetic field has been removed. FIG. 17C is the same image as FIG. 17B but without backlighting (e.g., in ambient light).

A method of forming a shielding component, comprising: applying a magnetic field in at least one direction to a suspension, wherein the suspension comprises a 1D or a 2D material disposed in a second component, wherein the second component comprises a polymer; orienting, in response to the application of the magnetic field, the 1D or 2D material to obtain a predetermined orientation. Subsequent to orienting, removing the magnetic field and removing or modifying the second component, wherein the 1D or 2D material maintains its orientation subsequent to removing the magnetic field and subsequent to removal or modification of the second component. In one example, the second component comprising a UV-curable polymer or other polymer in liquid form and modifying the second component comprises solidifying or partially solidifying the suspension to form an oriented component. The oriented component may be removably coupled to a device to act as a shield from thermal, electrical, or other undesirable environmental conditions to protect the underlying device.

A device comprising a magnetically oriented component coupled to an exterior of the device. The magnetically oriented component comprises a plurality of 1D and/or 2D materials oriented in a predetermined direction via the application of at least one magnetic field.

Exemplary embodiments are disclosed and variations, combinations, and/or modifications of the embodiment(s) and/or features of the embodiment(s) made by a person having ordinary skill in the art are within the scope of the disclosure. Alternate embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

The invention claimed is:

1. A method comprising:
   applying, to a suspension of a first component and a second component encased in a receptacle, a first magnetic field of a first intensity from a first direction relative to a first plane when the suspension is in proximity of a predetermined measurement area, and wherein the second component comprises at least one 1-dimensional or a 2-dimensional material, wherein the second component is present in the suspension from about 0.01 wt. % to about 0.2 wt. %, and wherein the first magnetic field comprises a strength of less than 0.24 Torr;
   orienting, in response to the application of the first magnetic field, a plurality of particles of the second component in a predetermined orientation relative to the first plane; and
   determining, based on the orientation response, a plurality of characteristics of the first magnetic field,
   wherein the second component comprises 2D few-layer graphene flakes produced via exfoliation of highly-oriented pyrolytic graphite (HOPG), wherein the few-layer graphene flakes comprise from 1-3 graphene layers, and wherein the second component does not comprise magnetic particles or paramagnetic particles.

2. The method of claim 1, further comprising forming the suspension by using a first component comprising at least one of deionized water, a basic solution, an acidic solution, or a polymer.

3. The method of claim 1, further comprising, subsequent to orienting the plurality of particles, modifying the first component, wherein modifying the first component comprises removing or solidifying the first component.

4. The method of claim 1, wherein each of the 1 to 3 layers is from 0.1 to 0.7 nm thick.

5. The method of claim 1, further comprising forming the suspension using the second component wherein a plurality of particles of the second component are from about 0.4 nm to about 100 nm in diameter.

6. The method of claim 1, further comprising forming the suspension using the second component wherein a plurality of particles of the second component are from 0.3 nm to about 100 nm thick.

7. The method of claim 4, further comprising forming the suspension wherein the second component comprises a plurality of graphene particles from about 0.5 μm to about 50.0 μm in maximum diameter and from about 0.4 nm to about 100 nm in thickness.

8. The method of claim 1, wherein applying the first magnetic field further comprises:
   applying a rotating magnetic field, wherein an angle of the first magnetic field with respect to the first plan changes over a predetermined period of time relative to the first plane, wherein the plurality of particles changes orientation in response to receiving the rotating magnetic field during the predetermined time such that the plurality of particles mirror a motion of a changing direction of the magnetic field.

9. The method of claim 3, wherein the second component comprises two or more materials selected from one-dimensional or two-dimensional materials, and wherein a first material of the second component comprises the few-layer graphene flakes and is oriented in response to the first magnetic field and wherein the orienting of the first material causes a second material of the second component to change its orientation.

10. A device comprising:
a suspension disposed in a vessel, wherein the suspension comprises a first component and a second component, wherein the second component is present in the suspension from about 0.01 wt. % to about 0.2 wt. %, wherein the second component comprises a plurality of particles comprising 2D few-layer graphene flakes produced via exfoliation of highly-oriented pyrolytic graphite (HOPG) graphite, wherein the few-layer graphene flakes comprise from 1-3 graphene layers, and wherein the second component does not comprise magnetic particles or paramagnetic particles, and
a processor,
wherein, in a first state, at least some particles of the second component comprise a first orientation relative to a first plane, and wherein the at least some particles of the second component are configured to, in second state, responsive to a magnetic field having a strength of less than 0.24 Torr, change from the first orientation to a plurality of subsequent, orientations that are different from the first orientation in response to a different magnetic field, and
wherein the processor is configured to determine a plurality of characteristics of the magnetic field.

11. The device of claim 10, wherein, in the second state, other particles in the suspension change from the first orientation to the plurality of subsequent, different orientations in response to the change in orientation of the at least some particles.

12. The device of claim 11, wherein the at least some particles are in contact with the other particles to cause the orientation change in the other particles.

13. The device of claim 11, wherein the other particles do not comprise graphene.

14. A device comprising:
a plurality of particles comprising 2D few-layer graphene flakes produced via exfoliation of highly-oriented pyrolytic graphite (HOPG), wherein the few-layer graphene flakes comprise from 1-3 graphene layers, wherein the plurality of particles are disposed in a suspension in a vessel, wherein the second component is present in the suspension from about 0.01 wt. % to about 0.2 wt. %, and wherein, in a first state, the plurality of particles comprise a first orientation relative to a first plane, and
a processor,
wherein the plurality of particles are pure in that they do not comprise magnetic particles or paramagnetic particles,
wherein the plurality of particles are configured to, in second state, change from the first orientation to a plurality of subsequent orientations that are different from the first orientation in response to a magnetic field having a strength of less than 0.24 Torr, and
wherein the processor is configured to determine a plurality of characteristics of the magnetic field.

15. The device of claim 14, further comprising the plurality of oriented graphene particles disposed in the suspension comprising deionized water or polymers.

16. The device of claim 14, wherein the plurality of graphene particles comprises a plurality of first dimensions.

17. The device of claim 14, further comprising a second plurality of particles disposed in the vessel or in a second vessel, wherein the second plurality of particles comprises a plurality of second dimensions.

18. The device of claim 17, wherein at least one dimension of the plurality of second dimensions is different than the at least one dimension of the plurality of first dimensions.

19. The method of claim 1 further comprising removing or modifying the first component such that the plurality of particles of the second component are locked in place.

20. The method of claim 1, wherein the apparatus consists of the first component and the second component, wherein the first component consists of water and the second component consists of the graphene flakes.

* * * * *

UNITED STATES PATENT AND TRADEMARK OFFICE
CERTIFICATE OF CORRECTION

| | |
|---|---|
| PATENT NO. | : 11,827,520 B2 |
| APPLICATION NO. | : 16/333547 |
| DATED | : November 28, 2023 |
| INVENTOR(S) | : Jiming Bao et al. |

It is certified that error appears in the above-identified patent and that said Letters Patent is hereby corrected as shown below:

In the Specification

Column 1 Line 25 Please replace the Statement Regarding Federally Sponsored Research or Development as follows:
--STATEMENT REGARDING FEDERALLY SPONSORED RESEARCH OR DEVELOPMENT
This invention was made with government support under ECCS1240510 awarded by the National Science Foundation. The government has certain rights in the invention.--

Signed and Sealed this
Twenty-sixth Day of March, 2024

Katherine Kelly Vidal
*Director of the United States Patent and Trademark Office*